US012615912B2

(12) United States Patent (10) Patent No.: US 12,615,912 B2
Lee (45) Date of Patent: Apr. 28, 2026

(54) DISPLAY DEVICE AND INPUT SYSTEM INCLUDING THE SAME

(71) Applicant: Samsung Display Co., LTD., Yongin-si (KR)

(72) Inventor: Hyeon Bum Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 698 days.

(21) Appl. No.: 17/987,358

(22) Filed: Nov. 15, 2022

(65) Prior Publication Data

US 2023/0200125 A1 Jun. 22, 2023

(30) Foreign Application Priority Data

Dec. 16, 2021 (KR) ......................... 10-2021-0180767

(51) Int. Cl.
| | |
|---|---|
| *H10K 50/86* | (2023.01) |
| *G06F 3/044* | (2006.01) |
| *H10K 59/38* | (2023.01) |
| *H10K 59/40* | (2023.01) |

(52) U.S. Cl.
CPC ......... *H10K 50/865* (2023.02); *G06F 3/0446* (2019.05); *H10K 59/38* (2023.02); *H10K 59/40* (2023.02)

(58) Field of Classification Search
CPC ...... H10K 50/865; H10K 59/40; H10K 59/38; G06F 3/0446
USPC ........................................................ 313/506
See application file for complete search history.

(56) References Cited

U.S. PATENT DOCUMENTS

| | | | |
|---|---|---|---|
| 9,887,390 B2 | 2/2018 | Kim | |
| 10,916,592 B2 | 2/2021 | Lee et al. | |
| 2019/0341428 A1 * | 11/2019 | Lee | ....................... H10K 59/38 |
| 2021/0036263 A1 | 2/2021 | Kim et al. | |

FOREIGN PATENT DOCUMENTS

| | | | | |
|---|---|---|---|---|
| CN | 108874220 A | * 11/2018 | ........... | G06F 3/0412 |
| JP | 2015-26049 | 2/2015 | | |
| KR | 10-2016-0035680 A | 4/2016 | | |
| KR | 10-2018-0063700 | 6/2018 | | |

(Continued)

OTHER PUBLICATIONS

English translation of CN 108874220 (Year: 2018).*

*Primary Examiner* — James R Greece
*Assistant Examiner* — Hana S Featherly
(74) *Attorney, Agent, or Firm* — Innovation Counsel LLP

(57) ABSTRACT

A display device comprises a display part including a light emitting element disposed in a plurality of emission areas to emit light, a plurality of touch electrodes disposed in a light blocking area surrounding the plurality of emission areas on the display part to sense a touch, a first light blocking part disposed in a part of the light blocking area on the plurality of touch electrodes, a second light blocking part disposed in another part of the light blocking area on the plurality of touch electrodes, and a code pattern determined by a planar shape of the second light blocking part to have position information. The first light blocking part comprises one of an inorganic black pigment and an organic black pigment, and the second light blocking part comprises the other of the inorganic black pigment and the organic black pigment.

20 Claims, 30 Drawing Sheets

(56)　　　　　References Cited

FOREIGN PATENT DOCUMENTS

| KR | 10-2019-0128010 | A | 11/2019 |
| KR | 10-2020-0039859 |   | 4/2020 |
| KR | 10-2021-0016233 | A | 2/2021 |

* cited by examiner

DU: SUB, TFTL, EML, TFEL
100: DU, TSU, CFL

CF: CF1, CF2, CF3

CF: CF1, CF2, CF3

CF: CF1, CF2, CF3

CF: CF1, CF2, CF3

CF: CF1, CF2, CF3

CF: CF1, CF2, CF3

CP: CP1, CP2, CP3

CP: CP1, CP2, CP3, CP4

CP: CP1, CP2, CP3, CP4

DISPLAY DEVICE AND INPUT SYSTEM INCLUDING THE SAME

CROSS-REFERENCE TO RELATED APPLICATION(S)

This application claims priority to and benefits of Korean Patent Application No. 10-2021-0180767 under 35 U.S.C. § 119, filed in the Korean Intellectual Property Office on Dec. 16, 2021, the entire contents of which are incorporated herein by reference.

BACKGROUND

1. Technical Field

The disclosure relates to a display device and an input system including the same, which is capable of performing a corresponding function by accurate input coordinates, reducing cost and power consumption, and simplifying a driving process without complex calculation or correction.

2. Description of the Related Art

The importance of display devices has been emphasized because of the increasing developments in information technology. The display devices display images in various ways. For example, the display devices are employed in various electronic devices such as smartphones, digital cameras, laptop computers, navigation devices, and smart televisions. The display devices may be flat panel display devices such as a liquid crystal display device, a field emission display device, and an organic light emitting display device. Among the flat panel display devices, the light emitting display device includes pixels each having the ability to emit light independently of a separate light source. Thus, an image may be displayed without a light emitting part providing light to the pixels of a display panel.

A touch sensor for supporting touch input by touching a screen with a user's body part (e.g., a finger) and an input pen is generally applied to the display device. Thus, the touch input using both of the user's body part and the input pen is more accurately sensed than the touch input using only the part of the user's body.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments provide a display device and an input system including the same, which is capable of generating input coordinate data of an input device without complex calculation or correction to perform a corresponding function by accurate input coordinates, reduce cost and power consumption, and simplify a driving process.

However, embodiments of the disclosure are not limited to those set forth herein. The above and other embodiments will become more apparent to one of ordinary skill in the art to which the disclosure pertains by referencing the detailed description of the disclosure given below.

According to an embodiment of the disclosure, a display device comprises a display part including a light emitting element disposed in a plurality of emission areas to emit light, a plurality of touch electrodes disposed in a light blocking area surrounding the plurality of emission areas on the display part to sense a touch, a first light blocking part disposed in a part of the light blocking area on the plurality of touch electrodes, a second light blocking part disposed in another part of the light blocking area on the plurality of touch electrodes, and a code pattern determined by a planar shape of the second light blocking part to have position information. The first light blocking part comprises one of an inorganic black pigment and an organic black pigment, and the second light blocking part comprises the other of the inorganic black pigment and the organic black pigment.

The first light blocking part and the second light blocking part may be disposed on a same layer.

The display device may further comprise a plurality of color filters disposed in the plurality of emission areas on the plurality of touch electrodes.

The first light blocking part, the second light blocking part, and the plurality of color filters may be disposed on a same layer.

The second light blocking part may not overlap the plurality of color filters in a thickness direction.

The display device may further comprise an insulating layer disposed between the plurality of touch electrodes and the first light blocking part.

The display device may further comprise an anti-reflection portion disposed in the plurality of emission areas on the plurality of touch electrodes.

The first light blocking part, the second light blocking part, and the anti-reflection portion may be disposed on a same layer.

The second light blocking part may not overlap the anti-reflection portion in a thickness direction.

The code pattern may surround at least one of the plurality of emission areas.

The code pattern may comprise a first portion extending in a first direction, and a second portion intersecting the first portion.

The code pattern may comprise a plurality of code patterns. The plurality of code patterns may have position information according to a distance between the plurality of code patterns.

The code pattern may have position information according to a relative position with respect to a reference point overlapping the plurality of touch electrodes in a thickness direction.

The display part may comprise a thin film transistor layer disposed on a substrate and comprising a plurality of thin film transistors, a light emitting element layer disposed on the thin film transistor layer and comprising a plurality of light emitting elements, and an encapsulation layer covering the light emitting element layer. The plurality of touch electrodes may be disposed on the encapsulation layer.

According to an embodiment of the disclosure, a display device comprises a display part comprising a light emitting element disposed in a plurality of emission areas to emit light, a plurality of touch electrodes disposed in a light blocking area surrounding the plurality of emission areas on the display part to sense a touch, a first light blocking part disposed in the light blocking area on the plurality of touch electrodes, a second light blocking part disposed on a part of the first light blocking part, and a plurality of code patterns determined by a planar shape of the second light blocking part. The first light blocking part comprises one of an inorganic black pigment and an organic black pigment, and the second light blocking part comprises the other of the inorganic black pigment and the organic black pigment. The plurality of code patterns have position information according to a distance between the plurality of code patterns and a planar shape.

The display device may further comprise a plurality of color filters disposed in the plurality of emission areas on the plurality of touch electrodes.

The first light blocking part and the plurality of color filters may be disposed on a same layer.

The second light blocking part may not overlap the plurality of color filters in a thickness direction.

The display device may further comprise an anti-reflection portion disposed in the plurality of emission areas on the plurality of touch electrodes.

According to an embodiment of the disclosure, an input system comprises a display device that displays an image, and an input device that inputs a touch into the display device. The display device comprises a display part comprising a light emitting element disposed in a plurality of emission areas to emit light, a plurality of touch electrodes disposed in a light blocking area surrounding the plurality of emission areas on the display part to sense a touch, a first light blocking part disposed in a part of the light blocking area on the plurality of touch electrodes, a second light blocking part disposed in another part of the light blocking area on the plurality of touch electrodes, and a code pattern determined by a planar shape of the second light blocking part to have position information. The first light blocking part comprises one of an inorganic black pigment and an organic black pigment, the second light blocking part comprises the other of the inorganic black pigment and the organic black pigment. The input device photographs the code pattern, converts the code pattern into a preset data code, and transmits coordinate data composed of the data codes to the display device.

In the display device and the input system including the same according to embodiments, the display device may include a first light blocking part having one of an inorganic black pigment and an organic black pigment, a second light blocking part having the other of the inorganic black pigment and the organic black pigment, and a code pattern determined by the planar shape of the second light blocking part and having position information, thereby receiving an input from the input device such as an input pen. At least one code pattern or a combination of code patterns may have position information according to a criterion, and may correspond to a preset data code one-to-one. Accordingly, the display device and the input system including the same may generate coordinate data composed of data codes without complex calculation or correction, thereby performing a corresponding function by accurate input coordinates, reducing cost and power consumption, and simplifying a driving process. Since the display device and the input system including the same include the first and second light blocking parts, they may not be limited in size and may be applied to all electronic devices having a touch function.

However, the effects of the disclosure are not limited to the aforementioned effects, and various other effects are included in the specification.

BRIEF DESCRIPTION OF THE DRAWINGS

An additional appreciation according to the embodiments of the disclosure will become more apparent by describing in detail the embodiments thereof with reference to the accompanying drawings, in which.

DETAILED DESCRIPTION OF THE EMBODIMENTS

Figure 1:
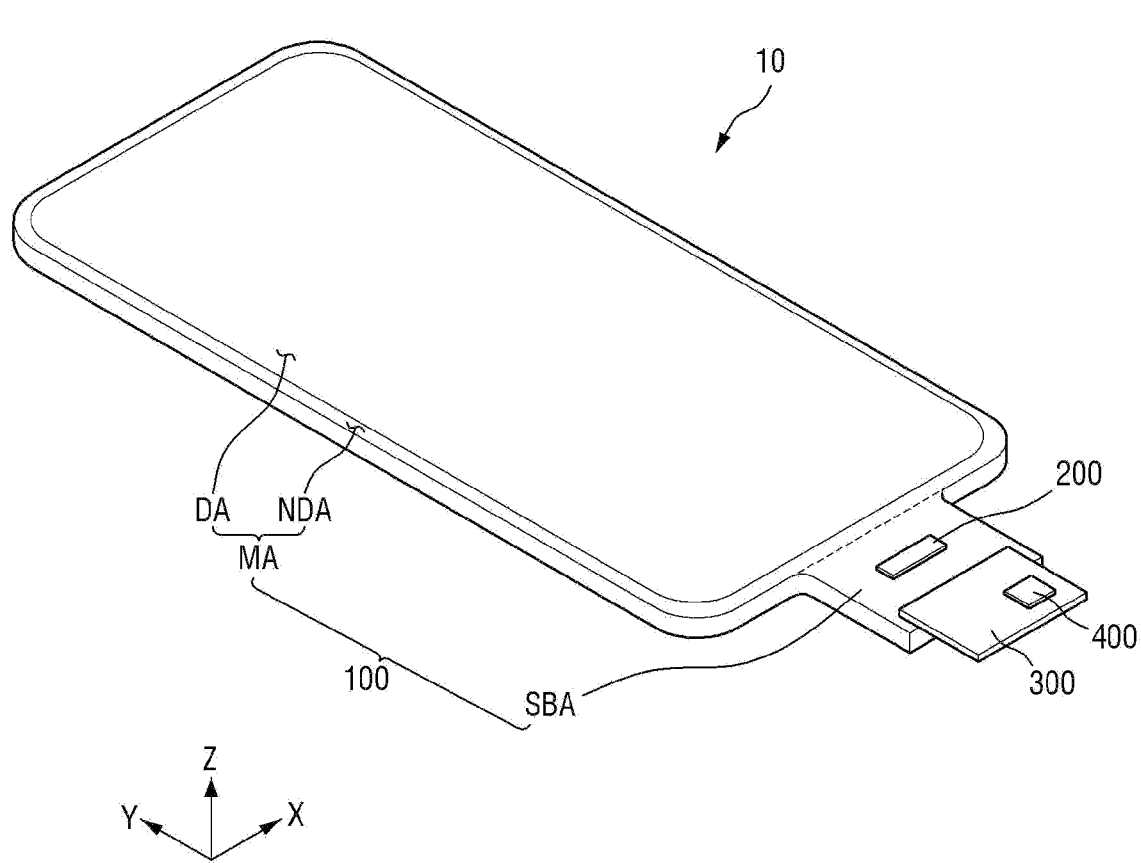
FIG. 1 is a schematic perspective view showing a display device according to an embodiment.

In the following description, for the purposes of explanation, numerous specific details are set forth in order to provide a thorough understanding of various embodiments or implementations of the disclosure. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. In other instances, various structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in other embodiments without departing from the disclosure.

Unless otherwise specified, the illustrated embodiments are to be understood as providing features of varying detail of some ways in which the disclosure may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concept.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

Further, the X-axis, the Y-axis, and the Z-axis are not limited to three axes of a rectangular coordinate system, and thus the X-, Y-, and Z-axes, and may be interpreted in a broader sense. For example, the X-axis, the Y-axis, and the Z-axis may be perpendicular to one another, or may represent different directions that are not perpendicular to one another.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," and the like may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" may encompass both an orientation of above and below. Furthermore, the apparatus may be otherwise oriented (e.g., rotated 90 degrees or at other orientations), and, as such, the spatially relative descriptors used herein should be interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, parts, and/or modules. Those skilled in the art will appreciate that these blocks, units, parts, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, parts, and/or modules being implemented by microprocessors or other similar hardware, they may be programmed and controlled using software (e.g., microcode) to perform various functions discussed herein and may optionally be driven by firmware and/or software. It is also contemplated that each block, unit, part, and/or module may be implemented by dedicated hardware, or as a combination of dedicated hardware to perform some functions and a processor (e.g., one or more programmed microprocessors and associated circuitry) to perform other functions. Also, each block, unit, part, and/or module of some embodiments may be physically separated into two or more interacting and discrete blocks, units, parts, and/or modules without departing from the scope of the inventive concept. Further, the blocks, units, parts, and/or modules of some embodiments may be physically combined into more complex blocks, units, parts, and/or modules without departing from the scope of the inventive concept.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

The phrase "at least one of is intended to include the meaning of" at least one selected from the group of for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or overly formal sense unless clearly so defined herein.

FIG. 1 is a schematic perspective view showing a display device according to an embodiment.

Referring to FIG. 1, a display device 10 may be applied to portable electronic devices such as a mobile phone, a smartphone, a tablet personal computer, a mobile communication terminal, an electronic organizer, an electronic book, a portable multimedia player (PMP), a navigation system, an ultra-mobile PC (UMPC), or the like. For example, the display device 10 may be applied as a display part of a television, a laptop, a monitor, a billboard, or an Internet-of-Things (IoT) device. For another example, the display device 10 may be applied to wearable devices such as a smart watch, a watch phone, a glasses type display, or a head mounted display (HMD).

The display device 10 may have a planar shape similar to a quadrilateral shape. For example, the display device 10 may have the shape similar to the quadrilateral shape, in a plan view, which has short sides in an X-axis direction and long sides in a Y-axis direction. A corner formed by the short side in the X-axis direction and the long side in the Y-axis direction may be rounded to have a curvature or may be right-angled. The planar shape of the display device 10 is not limited to the quadrilateral shape, and may be formed in a shape similar to another polygonal shape, a circular shape, or elliptical shape.

The display device 10 may include a display panel 100, a display driver 200, a circuit board 300, and a touch driver 400.

The display panel 100 may include a main region MA and a sub-region SBA.

The main region MA may include a display area DA including pixels displaying an image and a non-display area NDA disposed around the display area DA. The display area DA may emit light from emission areas or opening areas. For example, the display panel 100 may include a pixel circuit including switching elements, a pixel defining layer defining an emission area or an opening area, and a light emitting element emitting light independently.

For example, the light emitting element emitting the light independently may include at least one of an organic light emitting diode (LED) including an organic light emitting layer, a quantum dot LED including a quantum dot light emitting layer, an inorganic LED including an inorganic semiconductor, and a micro LED, but is not limited thereto.

The non-display area NDA may be an area outside the display area DA. The non-display area NDA may be defined as an edge area of the main region MA of the display panel 100. The non-display area NDA may include a gate driver (not illustrated) that supplies gate signals to gate lines, and fan-out lines (not illustrated) that electrically connect the display driver 200 to the display area DA.

The sub-region SBA may extend from a side of the main region MA. The sub-region SBA may include a flexible material which may be bent, folded or rolled. For example, in case that the sub-region SBA is bent, the sub-region SBA may overlap the main region MA in a thickness direction (e.g., a Z-axis direction). The sub-region SBA may include the display driver 200 and a pad part electrically connected to the circuit board 300. In other embodiment, the sub-region SBA may be omitted, and the display driver 200 and the pad part may be arranged in the non-display area NDA.

The display driver 200 may output signals and voltages for driving the display panel 100. The display driver 200 may supply data voltages to data lines. The display driver 200 may supply a power voltage to a power line and may supply a gate control signal to the gate driver. The display driver 200 may be formed as an integrated circuit (IC) and mounted on the display panel 100 by a chip on glass (COG) method, a chip on plastic (COP) method, or an ultrasonic bonding method. For example, the display driver 200 may be disposed in the sub-region SBA. The sub-region SBA may be bent, and the display driver 200 may overlap the main region MA in the thickness direction (e.g., the Z-axis direction). For another example, the display driver 200 may be mounted on the circuit board 300.

The circuit board 300 may be attached to the pad part of the display panel 100 by using an anisotropic conductive film (ACF). Lead lines of the circuit board 300 may be electrically connected to the pad part of the display panel 100. The circuit board 300 may be a flexible printed circuit board, a printed circuit board, or a flexible film such as a chip on film.

The touch driver 400 may be mounted on the circuit board 300. The touch driver 400 may be electrically connected to a touch sensing part of the display panel 100. The touch driver 400 may supply a touch driving signal to touch electrodes of the touch sensing part and may sense an amount of change in capacitance between the touch electrodes. For example, the touch driving signal may be a pulse signal having a frequency. The touch driver 400 may calculate whether an input is made and input coordinates based on an amount of change in capacitance between the touch electrodes. For example, the touch driver 400 may calculate a touch event and the input coordinates. The touch driver 400 may be formed of an integrated circuit (IC).

Figure 2:
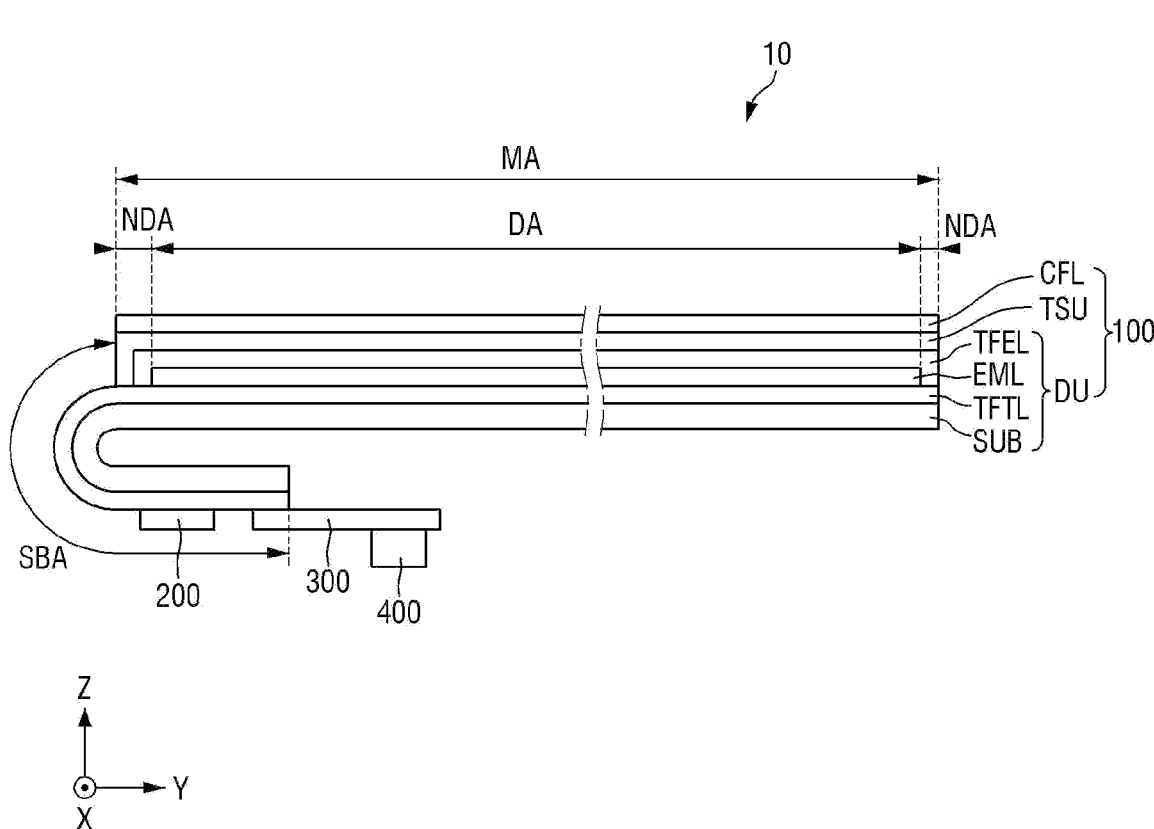
FIG. 2 is a schematic cross-sectional view illustrating a display device according to an embodiment.

FIG. 2 is a schematic cross-sectional view illustrating a display device according to an embodiment.

Referring to FIG. 2, the display panel 100 may include a display part DU, a touch sensing part TSU, and a color filter layer CFL. The display part DU may include a substrate SUB, a thin film transistor layer TFTL, a light emitting element layer EML, and an encapsulation layer TFEL.

The substrate SUB may be a base substrate or a base member. The substrate SUB may be a flexible substrate which may be bent, folded or rolled. For example, the substrate SUB may include a polymer resin such as poly-imide (PI), but is not limited thereto. For another example, the SUB may include a glass material or a metal material.

The thin film transistor layer TFTL may be disposed on the substrate SUB. The thin film transistor layer TFTL may include thin film transistors constituting the pixel circuit of the pixels. The thin film transistor layer TFTL may further include the gate lines, the data lines, power lines, gate control lines, the fan-out lines that electrically connect the display driver 200 to the data lines, and lead lines that electrically connect the display driver 200 to the pad part. Each of the thin film transistors may include a semiconductor region, a source electrode, a drain electrode, and a gate electrode. For example, in case that the gate driver is formed on a side of the non-display area NDA of the display panel 100, the gate driver may include thin film transistors.

The thin film transistor layer TFTL may be disposed in the display area DA, the non-display area NDA, and the sub-region SBA. The thin film transistors, the gate lines, the data lines, and the power lines of each of the pixels of the thin film transistor layer TFTL may be disposed in the display area DA. The gate control lines and the fan-out lines of the thin film transistor layer TFTL may be disposed in the non-display area NDA. The lead lines of the thin film transistor layer TFTL may be disposed in the sub-region SBA.

The light emitting element layer EML may be disposed on the thin film transistor layer TFTL. The light emitting element layer EML may include light emitting elements and a pixel defining layer. A first electrode, a light emitting layer, and a second electrode may be sequentially stacked one another in the light emitting elements to emit light. The pixel defining layer may define pixels. The light emitting elements of the light emitting element layer EML may be disposed in the display area DA.

For example, the light emitting layer may be an organic light emitting layer including an organic material. The light emitting layer may include a hole transporting layer, an organic light emitting layer, and an electron transporting layer. In case that the first electrode receives a voltage through the thin film transistor of the thin film transistor layer TFTL and the second electrode receives a cathode voltage, holes and electrons may be transferred to the organic light emitting layer through the hole transporting layer and the electron transporting layer, respectively. The holes and electrons may be combined with each other to emit light in the organic light emitting layer. For example, the first electrode may be an anode electrode, and the second electrode may be a cathode electrode, but the disclosure is not limited thereto.

For another example, the light emitting elements may include a quantum dot light emitting diode including a quantum dot light emitting layer, an inorganic light emitting diode including an inorganic semiconductor, or a micro light emitting diode.

The encapsulation layer TFEL may cover a top surface and a side surface of the light emitting element layer EML, and may protect the light emitting element layer EML. The encapsulation layer TFEL may include at least one inorganic layer and at least one organic layer for encapsulating the light emitting element layer EML.

The touch sensing part TSU may be disposed on the encapsulation layer TFEL. The touch sensing part TSU may include touch electrodes and touch lines. The touch electrodes may sense a user's touch in a capacitive manner. The touch lines may electrically connect the touch electrodes to the touch driver 400. For example, the touch sensing part TSU may sense the user's touch by using a mutual capacitance method or a self-capacitance method.

For another example, the touch sensing part TSU may be disposed on a separate substrate disposed on the display part DU. The substrate supporting the touch sensing part TSU may be a base member that encapsulates the display part DU.

The touch electrodes of the touch sensing part TSU may be disposed in a touch sensor area overlapping the display area DA in the thickness direction. The touch lines of the touch sensing part TSU may be disposed in a touch peripheral area that overlaps the non-display area NDA in the thickness direction.

The color filter layer CFL may be disposed on the touch sensing part TSU. The color filter layer CFL may include color filters respectively corresponding to the emission areas. Each of the color filters may selectively transmit light of a wavelength and may block or absorb light of a different wavelength. The color filter layer CFL may absorb a part of light coming from the outside of the display device 10 to reduce reflected light due to external light. Accordingly, the color filter layer CFL may prevent color distortion caused by the reflection of the external light.

Since the color filter layer CFL is disposed (e.g., directly disposed) on the touch sensing part TSU, the display device 10 may not require a separate substrate for the color filter layer CFL. Therefore, the thickness of the display device 10 may be relatively reduced.

The sub-region SBA of the display panel 100 may extend from the side of the main region MA. The sub-region SBA may include a flexible material which may be bent, folded or rolled. For example, in case that the sub-region SBA is bent, the sub-region SBA may overlap the main region MA in a thickness direction (e.g., the Z-axis direction). The sub-region SBA may include the display driver 200 and the pad part electrically connected to the circuit board 300.

Figure 3:
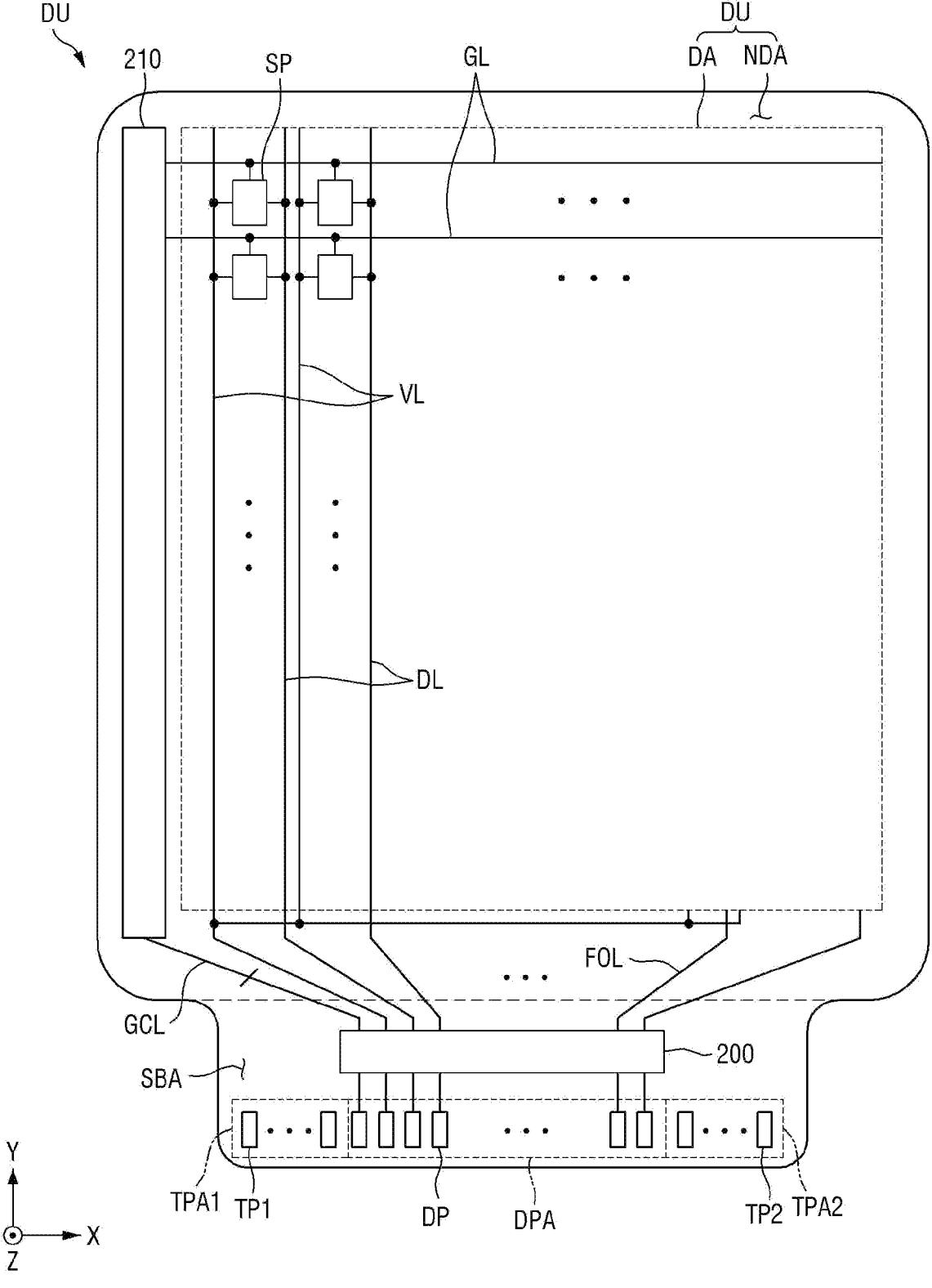
FIG. 3 is a schematic plan view illustrating a display part of a display device according to an embodiment.

FIG. 3 is a schematic plan view illustrating a display part of a display device according to an embodiment.

Referring to FIG. 3, the display part DU may include the display area DA and the non-display area NDA.

The display area DA, which is an area for displaying an image, may be defined as a central area of the display panel 100. The display area DA may include pixels SP, gate lines GL, data lines DL, and power lines VL. Each of the pixels SP may be defined as the smallest part that outputs light.

The gate lines GL may supply the gate signals received from a gate driver 210 to the pixels SP. The gate lines GL may extend in the X-axis direction and may be spaced apart from each other in the Y-axis direction that crosses (or intersects) the X-axis direction.

The data lines DL may supply the data voltages received from the display driver 200 to the pixels SP. The data lines DL may extend in the Y-axis direction and may be spaced apart from each other in the X-axis direction.

The power lines VL may supply the power voltage received from the display driver 200 to the pixels SP. The power voltage may be at least one of a driving voltage, an initialization voltage, a reference voltage, and a low potential voltage. The power lines VL may extend in the Y-axis direction and may be spaced apart from each other in the X-axis direction.

The non-display area NDA may surround the display area DA. The non-display area NDA may include the gate driver 210, fan-out lines FOL, and gate control lines GCL. The gate driver 210 may generate gate signals based on the gate control signal, and may sequentially supply the gate signals to the gate lines GL according to an order.

The fan-out lines FOL may extend from the display driver 200 to the display area DA. The fan-out lines FOL may supply the data voltage received from the display driver 200 to the data lines DL.

The gate control line GCL may extend from the display driver 200 to the gate driver 210. The gate control line GCL may supply the gate control signal received from the display driver 200 to the gate driver 210.

The sub-region SBA may include the display driver 200, a display pad area DPA, and first and second touch pad areas TPA1 and TPA2.

The display driver 200 may output signals and voltages for driving the display panel 100 to the fan-out lines FOL. The display driver 200 may supply the data voltage to the data line DL through the fan-out lines FOL. The data voltage may be supplied to the pixels SP to determine the luminance of the pixels SP. The display driver 200 may supply the gate control signal to the gate driver 210 through the gate control line GCL.

The display pad area DPA, the first touch pad area TPA1, and the second touch pad area TPA2 may be disposed at an edge of the sub-region SBA. The display pad area DPA, the first touch pad area TPA1, and the second touch pad area TPA2 may be electrically connected to the circuit board 300 by using a low-resistance high-reliability material such as an anisotropic conductive film or self-assembly anisotropic conductive paste (SAP).

The display pad area DPA may include display pad parts DP. The display pad parts DP may be electrically connected to a graphic system through the circuit board 300. The display pad parts DP may be electrically connected to the circuit board 300 to receive digital video data, and may supply the digital video data to the display driver 200.

Figure 4:
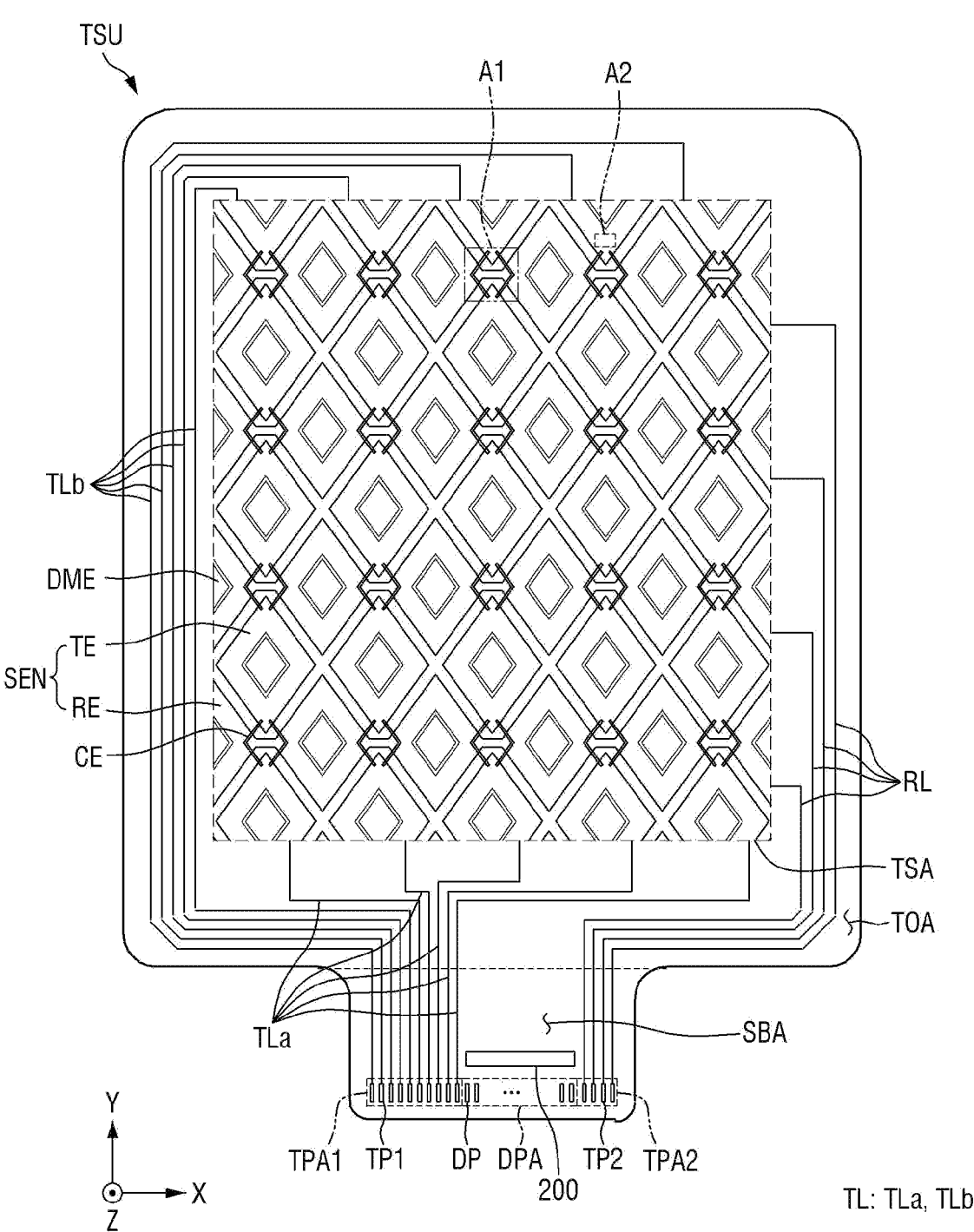
FIG. 4 is a schematic plan view illustrating a touch sensing part of a display device according to an embodiment.

FIG. 4 is a schematic plan view illustrating a touch sensing part of a display device according to an embodiment.

Referring to FIG. 4, the touch sensing part TSU may include a touch sensor area TSA for sensing a user's touch, and a touch peripheral area TOA disposed around the touch sensor area TSA. The touch sensor area TSA may overlap the display area DA of the display part DU, and the touch peripheral area TOA may overlap the non-display area NDA of the display part DU in a thickness direction.

The touch sensor area TSA may include touch electrodes SEN and dummy electrodes DME. The touch electrodes SEN may form mutual capacitance or self-capacitance to sense a touch (e.g., a touch event) of an object or a person. The touch electrodes SEN may include driving electrodes TE and sensing electrodes RE.

The driving electrodes TE may be arranged in the X-axis direction and the Y-axis direction. The driving electrodes TE may be spaced apart from each other in the X-axis direction and the Y-axis direction. Adjacent ones of the driving electrodes TE adjacent in the Y-axis direction may be electrically connected through a bridge electrode CE.

The driving electrodes TE may be electrically connected to a first touch pad part TP1 through a driving line TL. The driving line TL may include a lower driving line TLa and an upper driving line TLb. For example, the driving electrodes TE disposed under the touch sensor area TSA may be electrically connected to the first touch pad part TP1 through the lower driving line TLa, and the driving electrodes TE disposed on an upper side of the touch sensor area TSA may be electrically connected to the first touch pad part TP1 through the upper driving line TLb. The lower driving line TLa may extend to the first touch pad part TP1 through a lower side of the touch peripheral area TOA. The upper driving line TLb may extend to the first touch pad part TP1 through the upper side, a left side, and the lower side of the touch peripheral area TOA. For example, the upper driving line TLb may be disposed in the touch peripheral area TOA and bypass the touch sensing area TSA. The first touch pad part TP1 may be electrically connected to the touch driver 400 through the circuit board 300.

The bridge electrode CE may be bent at least once. For example, the bridge electrode CE may have an angle bracket shape (e.g., "<" or ">"), but the planar shape of the bridge electrode CE is not limited thereto. The adjacent ones of the driving electrodes TE adjacent to each other in the Y-axis direction may be electrically connected by multiple bridge electrodes CE. Thus, although any one of the bridge electrodes CE is disconnected, the adjacent ones of the driving electrodes TE adjacent to each other in the Y-axis direction may be stably connected to each other through a remaining one of the bridge electrode CE. The adjacent ones of the driving electrodes TE adjacent to each other in the Y-axis direction may be electrically connected to each other by two bridge electrodes CE, but the number of bridge electrodes CE is not limited thereto.

The bridge electrode CE may be disposed on a different layer from the driving electrodes TE and the sensing electrodes RE. Adjacent ones of the sensing electrodes RE adjacent to each other in the X-axis direction may be electrically connected through a connection portion disposed on the same layer as the driving electrodes TE or the sensing electrodes RE, and the adjacent ones of the driving electrodes TE adjacent in the Y-axis direction may be electrically connected through the bridge electrode CE disposed on a different layer from the driving electrodes TE or the sensing electrodes RE. Accordingly, although the bridge electrode CE overlaps the sensing electrodes RE in the Z-axis direction, the driving electrodes TE and the sensing electrodes RE may be electrically insulated from each other. Mutual capacitance may be formed between the driving electrode TE and the sensing electrode RE.

The sensing electrodes RE may extend in the X-axis direction and may be spaced apart from each other in the Y-axis direction. The sensing electrodes RE may be arranged in the X-axis direction and the Y-axis direction, and the adjacent ones of the sensing electrodes RE adjacent in the X-axis direction may be electrically connected through the connection portion.

The sensing electrodes RE may be electrically connected to the second touch pad part TP2 through a sensing line RL. For example, the sensing electrodes RE disposed on a right side of the touch sensor area TSA may be electrically connected to the second touch pad part TP2 through the sensing line RL. The sensing line RL may extend to the second touch pad part TP2 through the right side and the lower side of the touch peripheral area TOA. The second touch pad part TP2 may be electrically connected to the touch driver 400 through the circuit board 300.

Each of the dummy electrodes DME may be surrounded by the driving electrode TE or the sensing electrode RE.

Each of the dummy electrodes DME may be spaced apart from the driving electrode TE and the sensing electrode Re, and electrically insulated from the driving electrode TE or the sensing electrode RE. Accordingly, the dummy electrode DME may be electrically floated.

The display pad area DPA, the first touch pad area TPA1, and the second touch pad area TPA2 may be disposed at the edge of the sub-region SBA. The display pad area DPA, the first touch pad area TPA1, and the second touch pad area TPA2 may be electrically connected to the circuit board 300 by using a low-resistance high-reliability material such as an anisotropic conductive film or self-assembly anisotropic conductive paste (SAP).

The first touch pad area TPA1 may be disposed on a side of the display pad area DPA, and may include multiple first touch pad parts TP1. The first touch pad parts TP1 may be electrically connected to the touch driver 400 disposed on the circuit board 300. The first touch pad parts TP1 may supply a touch driving signal to the driving electrodes TE through driving lines TL.

The second touch pad area TPA2 may be disposed on another side of the display pad area DPA, and may include multiple second touch pad parts TP2. The second touch pad parts TP2 may be electrically connected to the touch driver 400 disposed on the circuit board 300. The touch driver 400 may receive a touch sensing signal through sensing lines RL electrically connected to the second touch pad parts TP2, and may sense a change in the mutual capacitance between the driving electrode TE and the sensing electrode RE.

As another example, the touch driver 400 may supply a touch driving signal to each of the driving electrodes TE and the sensing electrodes RE, and may receive a touch sensing signal from each of the driving electrodes TE and the sensing electrodes RE. The touch driver 400 may sense an amount of change in electric charge of each of the driving electrodes TE and the sensing electrodes RE based on the touch sensing signal.

Figure 5:
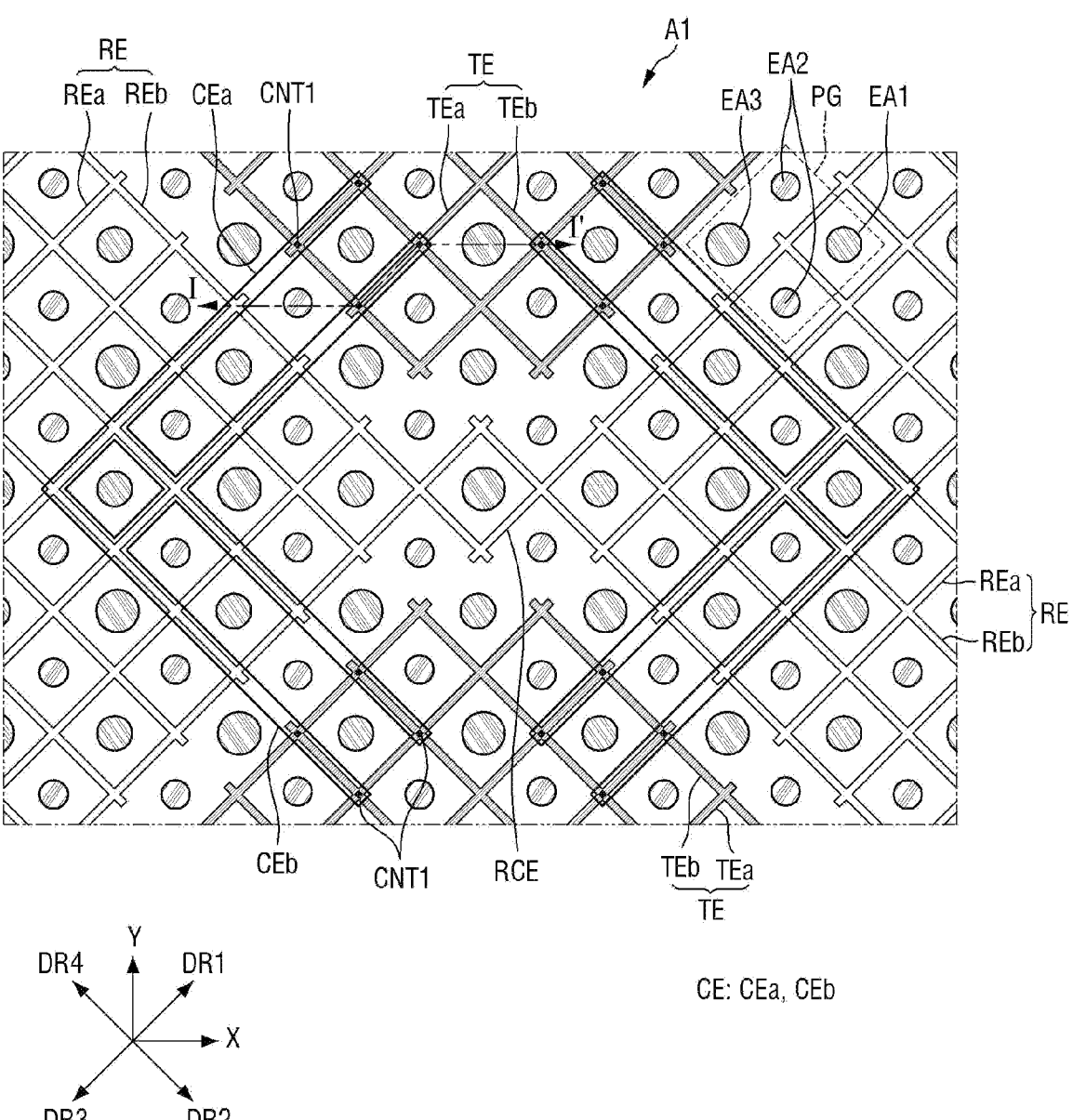
FIG. 5 is a schematic enlarged view of area A1 of FIG. 4.

FIG. 5 is a schematic enlarged view of area A1 of FIG. 4.

Referring to FIG. 5, the driving electrodes TE, the sensing electrodes RE, and the dummy electrodes DME may be disposed on a same layer and may be spaced apart from each other.

The driving electrodes TE may be arranged in the X-axis direction and the Y-axis direction. The driving electrodes TE may be spaced apart from each other in the X-axis direction and the Y-axis direction. The adjacent ones of the driving electrodes TE adjacent in the Y-axis direction may be electrically connected through the bridge electrode (or bridge electrodes) CE.

The sensing electrodes RE may extend in the X-axis direction and may be spaced apart from each other in the Y-axis direction. The sensing electrodes RE may be arranged in the X-axis direction and the Y-axis direction, and the adjacent ones of the sensing electrodes RE adjacent in the X-axis direction may be electrically connected through a connection portion RCE. For example, the connection portion RCE of the sensing electrodes RE may be disposed within the shortest distance between the driving electrodes TE adjacent to each other.

The bridge electrodes CE may be disposed on a different layer from the driving electrode TE and the sensing electrode RE. Each bridge electrode CE may include a first portion CEa and a second portion CEb. For example, the first portion CEa of the bridge electrode CE may be electrically connected to the driving electrode TE disposed on a side thereof through a first contact hole CNT1 and extend in a third direction DR3. The second portion CEb of the bridge electrode CE may be bent from the first portion CEa in an area overlapping the sensing electrode RE in the thickness direction to extend in a second direction DR2, and may be electrically connected to the driving electrode TE disposed on another side thereof through the first contact hole CNT1. A first direction DR1 may be a direction between the X-axis direction and the Y-axis direction. A second direction DR2 may be a direction between the opposite direction of the Y-axis and the X-axis direction. A third direction DR3 may be an opposite direction of the first direction DR1. A fourth direction DR4 may be an opposite direction of the second direction DR2. Accordingly, each of the bridge electrodes CE may electrically connect the adjacent ones of the driving electrodes TE in the Y-axis direction.

For example, the driving electrodes TE, the sensing electrodes RE, and the dummy electrodes DME may be formed in a planar mesh structure or a mesh structure. The driving electrodes TE, the sensing electrodes RE, and the dummy electrodes DME may surround each of first to third emission areas EA1, EA2, and EA3 of a pixel group PG in a plan view. Accordingly, the driving electrodes TE, the sensing electrodes RE, and the dummy electrodes DME may not overlap the first to third emission areas EA1, EA2, and EA3 in the thickness direction. The bridge electrodes CE may also not overlap the first to third emission areas EA1, EA2, and EA3 in the thickness direction. Accordingly, the display device 10 (e.g., refer to FIG. 2) may prevent the luminance of light emitted from the first to third emission areas EA1, EA2, and EA3 from being reduced by the touch sensing part TSU.

Each of the driving electrodes TE may include a first portion TEa extending in the first direction DR1 and a second portion TEb extending in the second direction DR2. Each of the sensing electrodes RE may include a first portion REa extending in the first direction DR1 and a second portion REb extending in the second direction DR2.

The pixels may include first to third pixels, and each of the first to third pixels may include the first to third emission areas EA1, EA2, and EA3. For example, the first emission area EA1 may emit light of a first color (or a red light), the second emission area EA2 may emit light of a second color (or a green light), and the third emission area EA3 may emit light of a third color (or a blue light), but is not limited thereto.

Each pixel group PG may include a first emission area EA1 (e.g., one first emission area EA1), two second emission areas EA2, and a third emission area EA3 (e.g., one third emission area EA3) to represent white gray scale, but the configuration of the pixel group PG is not limited thereto. The white gray scale may be represented by a combination of light emitted from the first emission area EA1, light emitted from two second emission areas EA2, and light emitted from the third emission area EA3.

The first to third emission areas EA1, EA2, and EA3 may be different in size from each other. For example, a size of the third emission area EA3 may be larger than that of the first emission area EA1, and a size of the first emission area EA1 may be larger than that of the second emission area EA2. However, the disclosure is not limited thereto. As another example, the first to third emission areas EA1, EA2, and EA3 may have a same size.

Figure 6:
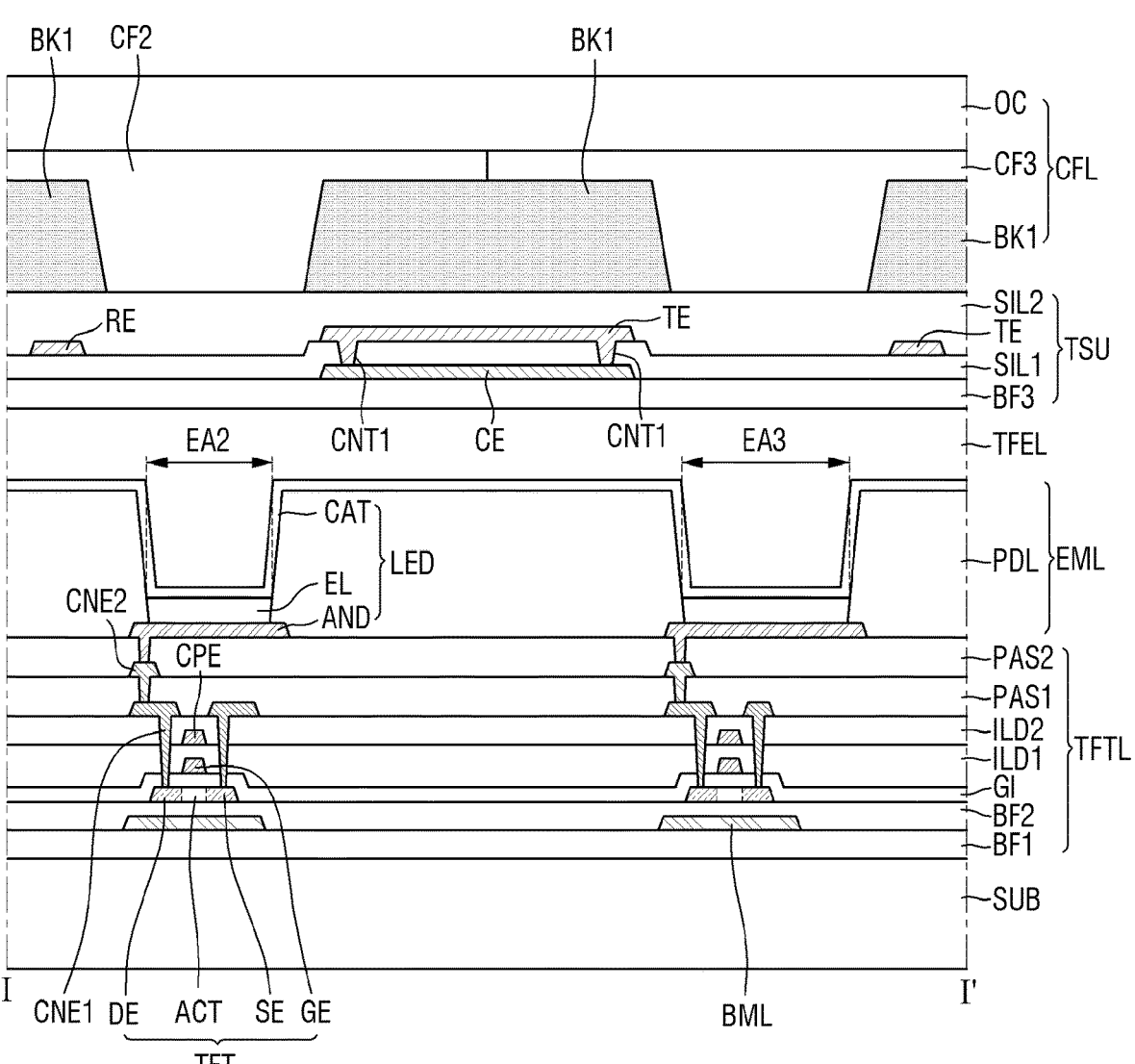
FIG. 6 is a schematic cross-sectional view taken along line I-I' of FIG. 5.

FIG. 6 is a schematic cross-sectional view taken along line I-I' of FIG. 5.

Referring to FIG. 6, the display panel 100 may include a display part DU, a touch sensing part TSU, and a color filter layer CFL. The display part DU may include the substrate SUB, the thin film transistor layer TFTL, the light emitting element layer EML, and the encapsulation layer TFEL.

The substrate SUB may be a base substrate or a base member. The substrate SUB may be a flexible substrate which may be bent, folded or rolled. For example, the substrate SUB may include a polymer resin such as polyimide (PI), but is not limited thereto. For another example, the SUB may include a glass material or a metal material.

The thin film transistor layer TFTL may include a first buffer layer BF1, a light blocking layer BML, a second buffer layer BF2, a thin film transistor TFT, a gate insulating layer GI, a first interlayer insulating layer ILD1, a capacitor electrode CPE, a second interlayer insulating layer ILD2, a first connection electrode CNE1, a first passivation layer PAS1, a second connection electrode CNE2, and a second passivation layer PAS2.

The first buffer layer BF1 may be disposed on the substrate SUB. The first buffer layer BF1 may include an inorganic layer capable of preventing penetration of air or moisture. For example, the first buffer layer BF1 may include inorganic layers alternately stacked each other.

The light blocking layer BML may be disposed on the first buffer layer BF1. For example, the light blocking layer BML may be formed as a single layer or multiple layers made of at least one of molybdenum (Mo), aluminum (Al), chromium (Cr), gold (Au), titanium (Ti), nickel (Ni), neodymium (Nd), and copper (Cu). For example, the single layer or the multiple layers of the light blocking layer BML may be made of an alloy thereof. For another example, the light blocking layer BML may be an organic layer including a black pigment.

The second buffer layer BF2 may cover the first buffer layer BF1 and the light blocking layer BML. The second buffer layer BF2 may include an inorganic layer capable of preventing penetration of air or moisture. For example, the second buffer layer BF2 may include inorganic layers alternately stacked each other.

The thin film transistor TFT may be disposed on the second buffer layer BF2, and may constitute a pixel circuit of each of the pixels. For example, the thin film transistor TFT may be a switching transistor or a driving transistor of the pixel circuit. The thin film transistor TFT may include a semiconductor region ACT, a source electrode SE, a drain electrode DE, and a gate electrode GE.

The semiconductor region ACT, the source electrode SE, and the drain electrode DE may be disposed on the second buffer layer BF2. The semiconductor region ACT, the source electrode SE, and the drain electrode DE may overlap the light blocking layer BML, in a thickness direction. The semiconductor region ACT may overlap the gate electrode GE in the thickness direction, and may be electrically insulated from the gate electrode GE by the gate insulating layer GI. The source electrode SE and the drain electrode DE may be provided by making a material of the semiconductor region ACT conductive. For example, impurities may be doped on portions of the semiconductor region ACT to form the source electrode SE and the drain electrode DE having electrical conductivity.

The gate electrode GE may be disposed on the gate insulating layer GI. The gate electrode GE may overlap the semiconductor region ACT with the gate insulating layer GI interposed therebetween.

The gate insulating layer GI may be disposed on the semiconductor region ACT, the source electrode SE, and the drain electrode DE. For example, the gate insulating layer GI may cover the semiconductor region ACT, the source electrode SE, the drain electrode DE, and the second buffer layer BF2, and may electrically insulate the semiconductor region ACT from the gate electrode GE. The gate insulating layer GI may include a contact hole through which the first connection electrode CNE1 passes.

The first interlayer insulating layer ILD1 may cover the gate electrode GE and the gate insulating layer GI. The first interlayer insulating layer ILD1 may include a contact hole through which the first connection electrode CNE1 passes. The contact hole of the first interlayer insulating layer ILD1 may be connected (e.g., physically connected) to the contact hole of the gate insulating layer GI and a contact hole of the second interlayer insulating layer ILD2. For example, the contact hole of the first interlayer insulating layer ILD1, the contact hole of the gate insulating layer GI, and the contact hole of the second interlayer insulating layer ILD2 may overlap one another in the thickness direction.

The capacitor electrode CPE may be disposed on the first interlayer insulating layer ILD1. The capacitor electrode CPE may overlap the gate electrode GE in the thickness direction. The capacitor electrode CPE and the gate electrode GE may form a capacitance.

The second interlayer insulating layer ILD2 may cover the capacitor electrode CPE and the first interlayer insulating layer ILD1. The second interlayer insulating layer ILD2 may include the contact hole through which the first connection electrode CNE1 passes. The contact hole of the second interlayer insulating layer ILD2 may be connected (e.g., physically connected) to the contact hole of the first interlayer insulating layer ILD1 and the contact hole of the gate insulating layer GI.

The first connection electrode CNE1 may be disposed on the second interlayer insulating layer ILD2. The first connection electrode CNE1 may electrically connect the drain electrode DE of the thin film transistor TFT to the second connection electrode CNE2. The first connection electrode CNE1 may be inserted into the contact holes provided in the second interlayer insulating layer ILD2, the first interlayer insulating layer ILD1, and the gate insulating layer GI, and may be in contact with the drain electrode DE of the thin film transistor TFT.

The first passivation layer PAS1 may cover the first connection electrode CNE1 and the second interlayer insulating layer ILD2. The first passivation layer PAS1 may protect the thin film transistor TFT. The first passivation layer PAS1 may include a contact hole through which the second connection electrode CNE2 passes.

The second connection electrode CNE2 may be disposed on the first passivation layer PAS1. The second connection electrode CNE2 may electrically connect the first connection electrode CNE1 to a pixel electrode AND of the light emitting element LED. The second connection electrode CNE2 may be inserted into the contact hole provided in the first passivation layer PAS1, and may be in contact with the first connection electrode CNE1.

The second passivation layer PAS2 may cover the second connection electrode CNE2 and the first passivation layer PAS1. The second passivation layer PAS2 may include a contact hole through which the pixel electrode AND of the light emitting element LED passes.

The light emitting element layer EML may be disposed on the thin film transistor layer TFTL. The light emitting element layer EML may include the light emitting element LED and a pixel defining layer PDL. The light emitting element LED may include the pixel electrode AND, a light emitting layer EL, and a common electrode CAT.

The pixel electrode AND may be disposed on the second passivation layer PAS2. The pixel electrode AND may overlap one of the first to third emission areas EA1, EA2, and EA3 defined by the pixel defining layer PDL in the thickness direction. The pixel electrode AND may be electrically connected to the drain electrode DE of the thin film transistor TFT through the first and second connection electrodes CNE1 and CNE2.

The light emitting layer EL may be disposed on the pixel electrode AND. For example, the light emitting layer EL may be an organic light emitting layer made of an organic material, but is not limited thereto. In case that the light emitting layer EL includes the organic light emitting layer, the thin film transistor TFT may apply a voltage to the pixel electrode AND of the light emitting element LED. In case that the common electrode CAT of the light emitting element LED receives a common voltage or a cathode voltage, the holes and electrons may move to the light emitting layer EL through the hole transport layer and the electron transport layer and may be combined to produce light. Thus, the light emitting layer EL may emit the light.

The common electrode CAT may be arranged on the light emitting layer EL. For example, the common electrode CAT may be made in the form of an electrode common to all of the pixels. The common electrode CAT may not be made in the form specific to each of the pixels. The common electrode CAT may be disposed on the light emitting layer EL in the first to third emission areas EA1, EA2, and EA3, and may be disposed on the pixel defining layer PDL in an area other than the first to third emission areas EA1, EA2, and EA3. For example, the common electrode CAT may be disposed on the light emitting layer EL, which is disposed in the first to third emission areas EA1, EA2, and EA3, and the pixel defining layer PDL, which is disposed between the first to third emission areas EA1, EA2, and EA3.

The common electrode CAT may receive the common voltage or a low potential voltage. In case that the pixel electrode AND receives a voltage corresponding to a data voltage and the common electrode CAT receives the low potential voltage, a potential difference is formed between the pixel electrode AND and the common electrode CAT, so that the light emitting layer EL may emit the light.

The pixel defining layer PDL may define the first to third emission areas EA1, EA2, and EA3. The pixel defining layer PDL may separate and electrically insulate the pixel electrode AND of each of the light emitting elements ED. For example, the pixel defining layer PDL may be disposed between adjacent ones of the pixel electrodes AND of the light emitting electrodes ED. The pixel defining layer PDL may include a light absorbing material. The pixel defining layer PDL may prevent light reflection.

The encapsulation layer TFEL may be disposed on the common electrode CAT to cover the light emitting elements LED. The encapsulation layer TFEL may include at least one inorganic layer to prevent oxygen or moisture from penetrating into the light emitting element layer EML. The encapsulation layer TFEL may include at least one organic layer to protect the light emitting element layer EML from foreign matters such as dust.

The touch sensing part TSU may be disposed on the encapsulation layer TFEL. The touch sensing part TSU may include a third buffer layer BF3, the bridge electrode CE, a first insulating layer SILL the driving electrode TE, the sensing electrode RE, and a second insulating layer SIL2.

The third buffer layer BF3 may be disposed on the encapsulation layer TFEL. The third buffer layer BF3 may have an insulating and optical function. For example, the third buffer layer BF3 may be electrically insulative and improve optical characteristics of the display panel 100. The third buffer layer BF3 may include at least one inorganic layer. In other embodiments, the third buffer layer BF3 may be omitted.

The bridge electrode CE may be disposed on the third buffer layer BF3. The bridge electrode CE may be disposed on a different layer from the driving electrode TE and the sensing electrode RE to electrically connect the adjacent ones of the driving electrodes TE adjacent in the Y-axis direction to each other.

The first insulating layer SIL1 may cover the bridge electrode CE and the third buffer layer BF3. The first insulating layer SIL1 may have an insulating and optical function. For example, the first insulating layer SIL1 may be electrically insulative and improve optical characteristics of the display panel 100. For example, the first insulating layer SIL1 may be an inorganic layer containing at least one of a silicon nitride layer, a silicon oxynitride layer, a silicon oxide layer, a titanium oxide layer, and an aluminum oxide layer.

The driving electrode TE and the sensing electrode RE may be disposed on the first insulating layer SIL1. Each of the driving electrode TE and the sensing electrode RE may not overlap the first to third emission areas EA1, EA2, and EA3 in the thickness direction. Each of the driving electrode TE and the sensing electrode RE may be formed of a single layer containing at least one of molybdenum (Mo), titanium (Ti), copper (Cu), aluminum (Al), and indium tin oxide (ITO), or may be formed to have a stacked structure (Ti/Al/Ti) of aluminum and titanium, a stacked structure (ITO/Al/ITO) of aluminum and ITO, an Ag—Pd—Cu (APC) alloy (e.g., a single layer of the APC alloy), or a stacked structure (ITO/APC/ITO) of APC alloy and ITO.

The second insulating layer SIL2 may cover the driving electrode TE, the sensing electrode RE, and the first insulating layer SIL1. The second insulating layer SIL2 may have an insulating and optical function. For example, the second insulating layer SIL2 may be electrically insulative and improve optical characteristics of the display panel 100. The second insulating layer SIL2 may be made of the material in association with the first insulating layer SIL1.

The color filter layer CFL may be disposed on the touch sensing part TSU. The color filter layer CFL may include a first light blocking part BK1, a second color filter CF2, a third color filter CF3, and a planarization layer OC.

The first light blocking part BK1 may be disposed on the second insulating layer SIL2. The first light blocking part BK1 may contain a light absorbing material. For example, the first light blocking part BK1 may include an inorganic black pigment or an organic black pigment. The inorganic black pigment of the first light blocking part BK1 may be carbon black, and the organic black pigment of the first light blocking part BK1 may include at least one of lactam black, perylene black, and aniline black, but the disclosure is not limited thereto. The first light blocking part BK1 may prevent visible light infiltration and color mixture between the first to third emission areas EA1, EA2, and EA3. Thus, color reproducibility of the display device 10 may be improved.

The second color filter CF2 may correspond to the second emission area EA2, and the third color filter CF3 may correspond to the third emission area EA3. The second and third color filters CF2 and CF3 may be disposed on the second insulating layer SIL2 in the second and third emission areas EA2 and EA3 and may be disposed on the first light blocking part BK1 in a light blocking area. For example, the second color filter CF2 may be disposed on the second insulating layer SIL2 in the second emission area EA2 and a portion of the first light blocking part BK1, which is adjacent to the second emission area EA2. The third color filter CF3 may be disposed on the third insulating layer SIL3 in the third emission area EA3 and a portion of the first light blocking part BK1, which is adjacent to the third emission area EA3. The second and third color filters CF2 and CF3 may absorb a part of the light coming from the outside of the display device 10 to reduce the reflected light of the external light. Thus, the second and third color filters CF2 and CF3 may prevent color distortion caused by the reflection of the external light.

The planarization layer OC may be disposed on the second and third color filters CF2 and CF3 to planarize an upper end of the color filter layer CFL. For example, the planarization layer OC may include an organic material.

Figure 7:
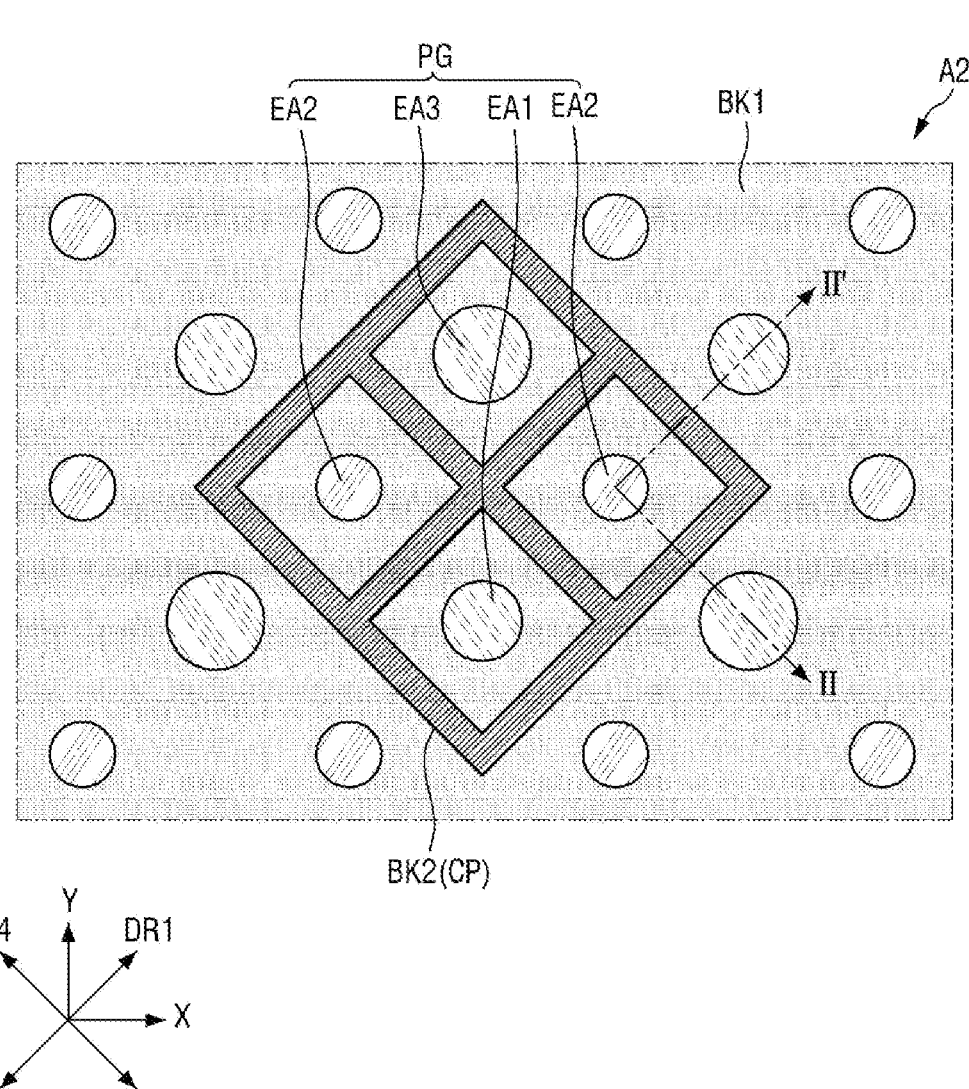
FIG. 7 is a schematic enlarged view illustrating an example of area A2 of FIG. 4.
Figure 8:
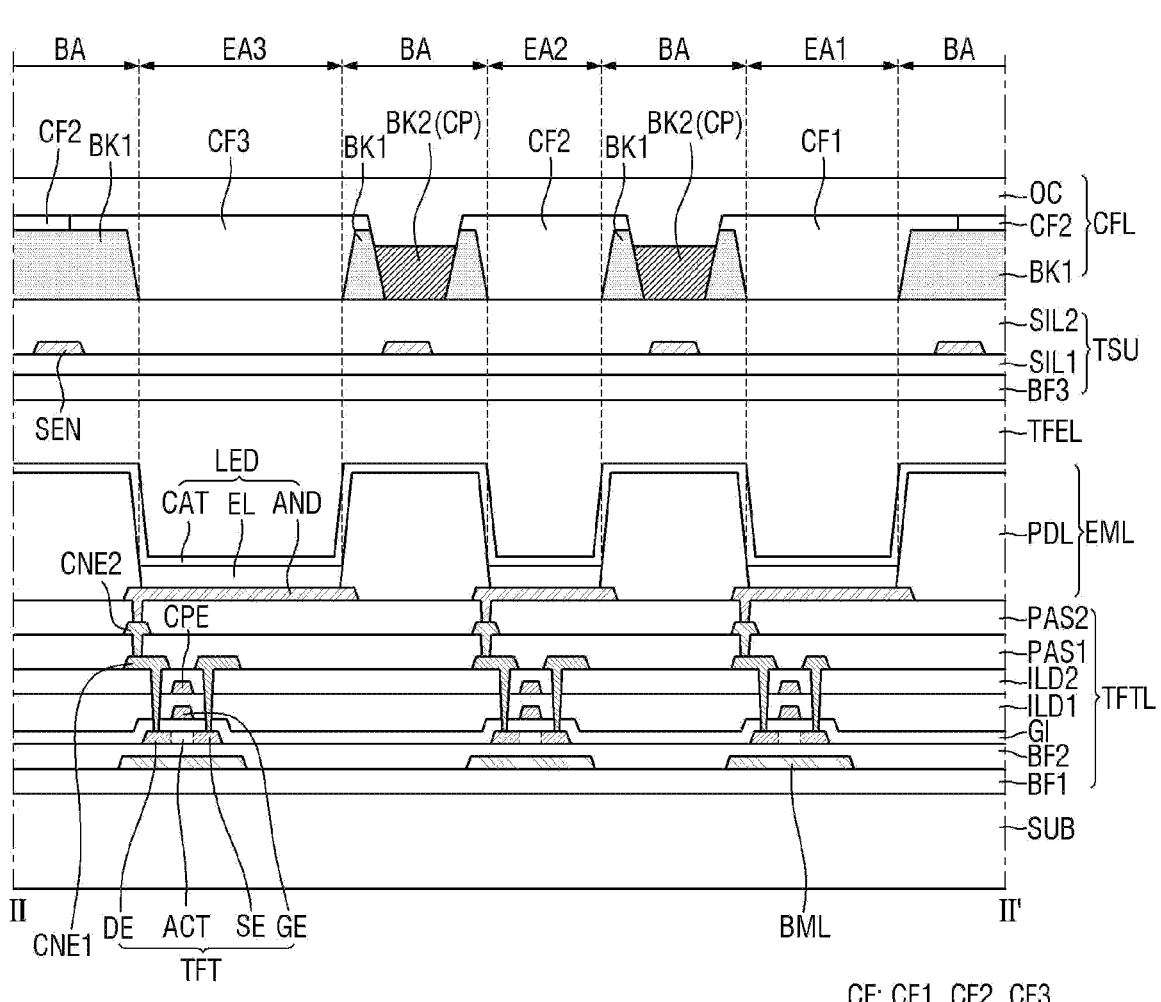
FIG. 8 is a schematic cross-sectional view of an example taken along line II-II' of FIG. 7.

FIG. 7 is a schematic enlarged view illustrating an example of area A2 of FIG. 4. FIG. 8 is a cross-sectional view of an example taken along line II-II' of FIG. 7. Detailed description of the same constituent elements is omitted.

Referring to FIGS. 7 and 8, the color filter layer CFL may be disposed on the touch sensing part TSU. The color filter layer CFL may include first and second light blocking parts BK1 and BK2, a code pattern CP, first to third color filters CF1, CF2, and CF3, and the planarization layer OC.

The first light blocking part BK1 may be disposed on the second insulating layer SIL2 in a light blocking area BA. The light blocking area BA may surround the first to third emission areas EA1, EA2, and EA3. The first light blocking part BK1 may overlap the touch electrode SEN in the thickness direction to prevent light reflection by the touch electrode SEN. The first light blocking part BK1 may contain a light absorbing material. For example, the first light blocking part BK1 may include an inorganic black pigment or an organic black pigment. The inorganic black pigment of the first light blocking part BK1 may be carbon black, and the organic black pigment of the first light blocking part BK1 may include at least one of lactam black, perylene black, and aniline black, but the disclosure is not limited thereto. The first light blocking part BK1 may prevent visible light infiltration and color mixture between the first to third emission areas EA1, EA2, and EA3. Thus, color reproducibility of the display device 10 may be improved.

The second light blocking part BK2 may be disposed on the second insulating layer SIL2 in a part of the light blocking area BA. The second light blocking part BK2 may be surrounded by the first light blocking part BK1. The second light blocking part BK2 may be formed in a region formed by etching a part of the first light blocking part BK1. A height of the second light blocking part BK2 may be lower than a height of the first light blocking part BK1, but is not limited thereto. The second light blocking part BK2 may overlap the touch electrode SEN in the thickness direction to prevent the light reflection by the touch electrode SEN. The second light blocking part BK2 may include a material different from that of the first light blocking part BK1. The second light blocking part BK2 may include an inorganic black pigment or an organic black pigment. For example, when the first light blocking part BK1 includes the organic black pigment, the second light blocking part BK2 may include the inorganic black pigment. As another example, when the first light blocking part BK1 includes the inorganic black pigment, the second light blocking part BK2 may include the organic black pigment.

The first and second light blocking parts BK1 and BK2 may have different light transmittances for a wavelength. For example, when the first light blocking part BK1 includes the organic black pigment and the second light blocking part BK2 includes the inorganic black pigment, a transmittance of the first light blocking part BK1 with respect to infrared light may be significantly higher than a transmittance of the second light blocking part BK2 with respect to infrared light. The first light blocking part BK1 may transmit most of the infrared light, and the second light blocking part BK2 may absorb most of the infrared light. Accordingly, in case that an infrared camera photographs the color filter layer CFL, the second light blocking part BK2 may be distinguished from the first light blocking part BK1, and the code pattern CP may be determined by a planar shape of the second light blocking part BK2. Since the code pattern CP is photographed by the infrared camera, an image quality of the display device 10 may not be deteriorated.

The code pattern CP may surround at least one of the first to third emission areas EA1, EA2, and EA3. The code pattern CP may be formed in a mesh structure or a net structure in a plan view. For example, the code pattern CP may surround a first emission area EA1 (e.g., one first emission area EA1), two second emission areas EA2, and a third emission area EA3 (e.g., one third emission area EA3) forming each pixel group PG, but is not limited thereto. The code pattern CP may not overlap the first to third emission areas EA1, EA2, and EA3 in the thickness direction. Accordingly, the display device 10 may prevent the luminance of light emitted from the first to third emission areas EA1, EA2, and EA3 from being reduced by the second light blocking part BK2 or the code pattern CP.

Multiple code patterns CP may be disposed across a region (e.g., the entire region) of the color filter layer CFL, and each of the code patterns CP may have position information according to a criterion. The code pattern CP may be photographed by a camera approaching the front of the display device 10, and may be identified through a captured picture or image. At least one code pattern CP or a combination of the code patterns CP may correspond to a preset data code value. For example, the code pattern CP disposed at a position may correspond to a data code designated at the corresponding position.

Since the display device 10 includes the first and second light blocking parts BK1 and BK2 and the code patterns CP determined by the planar shape of the second light blocking part BK2, the display device 10 may receive an input from an input device such as an input pen. The input pen may be a smart pen, an electromagnetic pen, or an active pen, but is not limited thereto. At least one code pattern CP or a combination of the code patterns CP may have the position information according to the criterion, and may correspond to a preset data code one-to-one. Accordingly, the display device 10 may receive coordinate data generated without complex calculation or correction by using the data code, thereby performing the corresponding function according to the correct input coordinates, reducing cost and power consumption, and simplifying a driving process. The display device 10 may include a code pattern CP incorporated in the color filter layer CFL, and thus may not be limited in size and may be applied to all electronic devices.

The first color filter CF1 may be disposed in the first emission area EA1 on the second insulating layer SIL2. The first color filter CF1 may cover a part of a top surface of the first light blocking part BK1. The first color filter CF1 may selectively pass the first color light (e.g., red light) therethrough, and block or absorb the second color light (e.g., green light) and the third color light (e.g., blue light). For example, the first color filter CF1 may be a red color filter and contain a red colorant.

The second color filter CF2 may be disposed in the second emission area EA2 on the second insulating layer SIL2. The second color filter CF2 may cover a part of the top surface of the first light blocking part BK1. The second color filter CF2 may selectively pass the second color light (e.g., green light) therethrough, and block or absorb the first color light (e.g., red light) and the third color light (e.g., blue light). For example, the second color filter CF2 may be a green color filter and contain a green colorant.

The third color filter CF3 may be disposed in the third emission area EA3 on the second insulating layer SIL2. The third color filter CF3 may cover a part of the top surface of the first light blocking part BK1. The third color filter CF3 may selectively pass the third color light (e.g., blue light) therethrough, and block or absorb the first color light (e.g., red light) and the second color light (e.g., green light). For example, the third color filter CF3 may be a blue color filter and contain a blue colorant.

The first to third color filters CF1, CF2, and CF3 may absorb a part of the light coming from the outside of the display device 10 to reduce the reflected light of the external light. Thus, the first to third color filters CF1, CF2, and CF3 may prevent color distortion caused by the reflection of the external light.

Since the color filter layer CFL is disposed (e.g., directly disposed) on the touch sensing part TSU, the display device 10 may not require a separate substrate for the color filter layer CFL. Therefore, the thickness of the display device 10 may be relatively reduced.

The planarization layer OC may be disposed on the first to third color filters CF1, CF2, and CF3 and the second light blocking part BK2 to planarize an upper end of the color filter layer CFL. For example, the planarization layer OC may include an organic material.

FIGS. 9 to 12 are schematic cross-sectional views illustrating a manufacturing process of the display device of FIG. 8.

Figure 9:
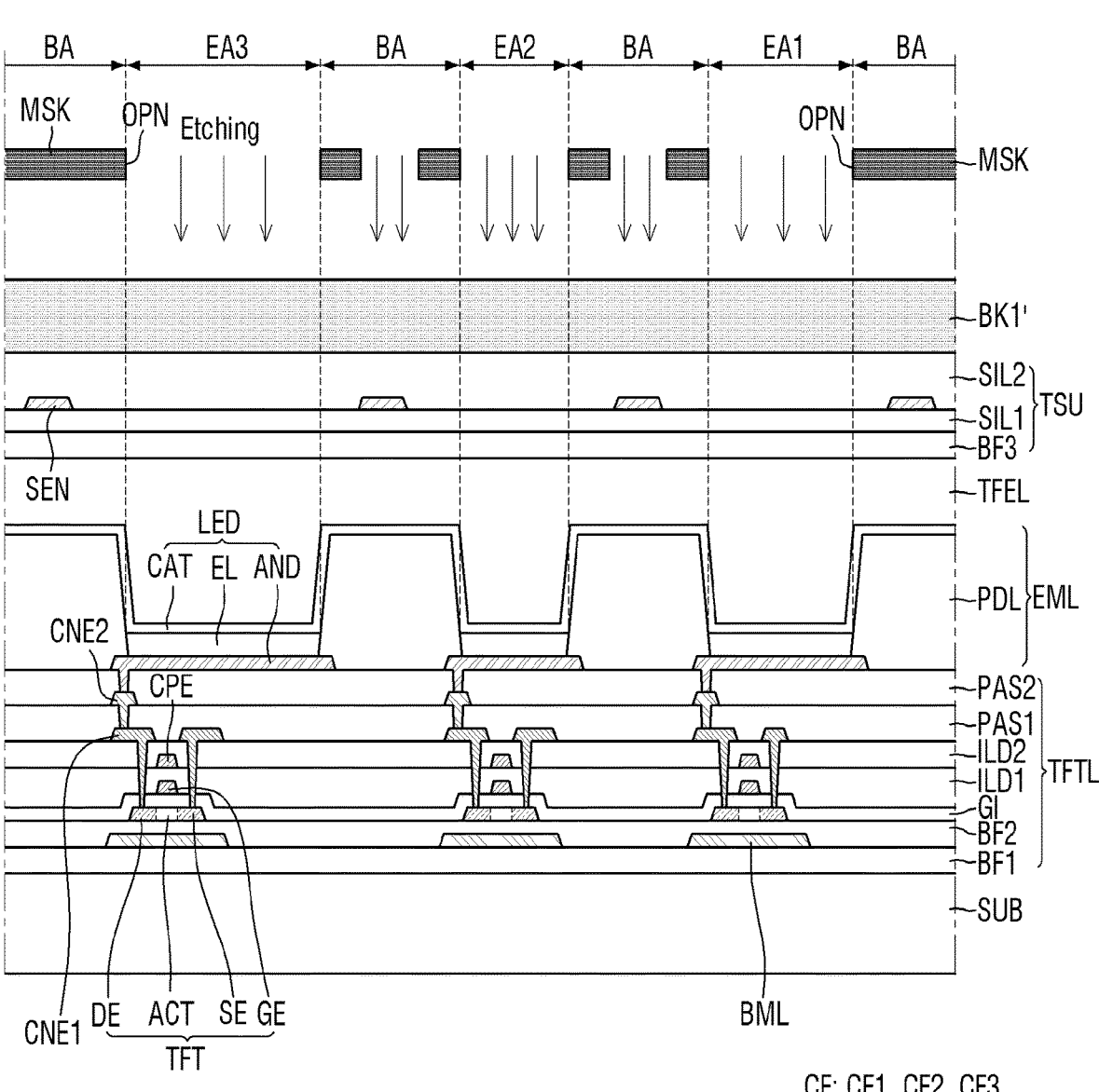
FIGS. 9 to 12 are schematic cross-sectional views illustrating a manufacturing process of the display device of FIG. 8.

In FIG. 9, the thin film transistor layer TFTL, the light emitting element layer EML, the encapsulation layer TFEL, and the touch sensing part TSU may be sequentially stacked on the substrate SUB.

A layer BK1' for forming the first light blocking part BK1 (e.g., refer to FIG. 10) may be formed on a surface (e.g., the entire surface) of the second insulating layer SIL2. The layer BK1' for forming the first light blocking part BK1 may contain a light absorbing material. For example, the layer BK1' for forming the first light blocking part BK1 may include an inorganic black pigment or an organic black pigment. The inorganic black pigment of the layer BK1' may be carbon black, and the organic black pigment of the layer BK1' may include at least one of lactam black, perylene black, and aniline black, but the disclosure is not limited thereto.

Figure 10:
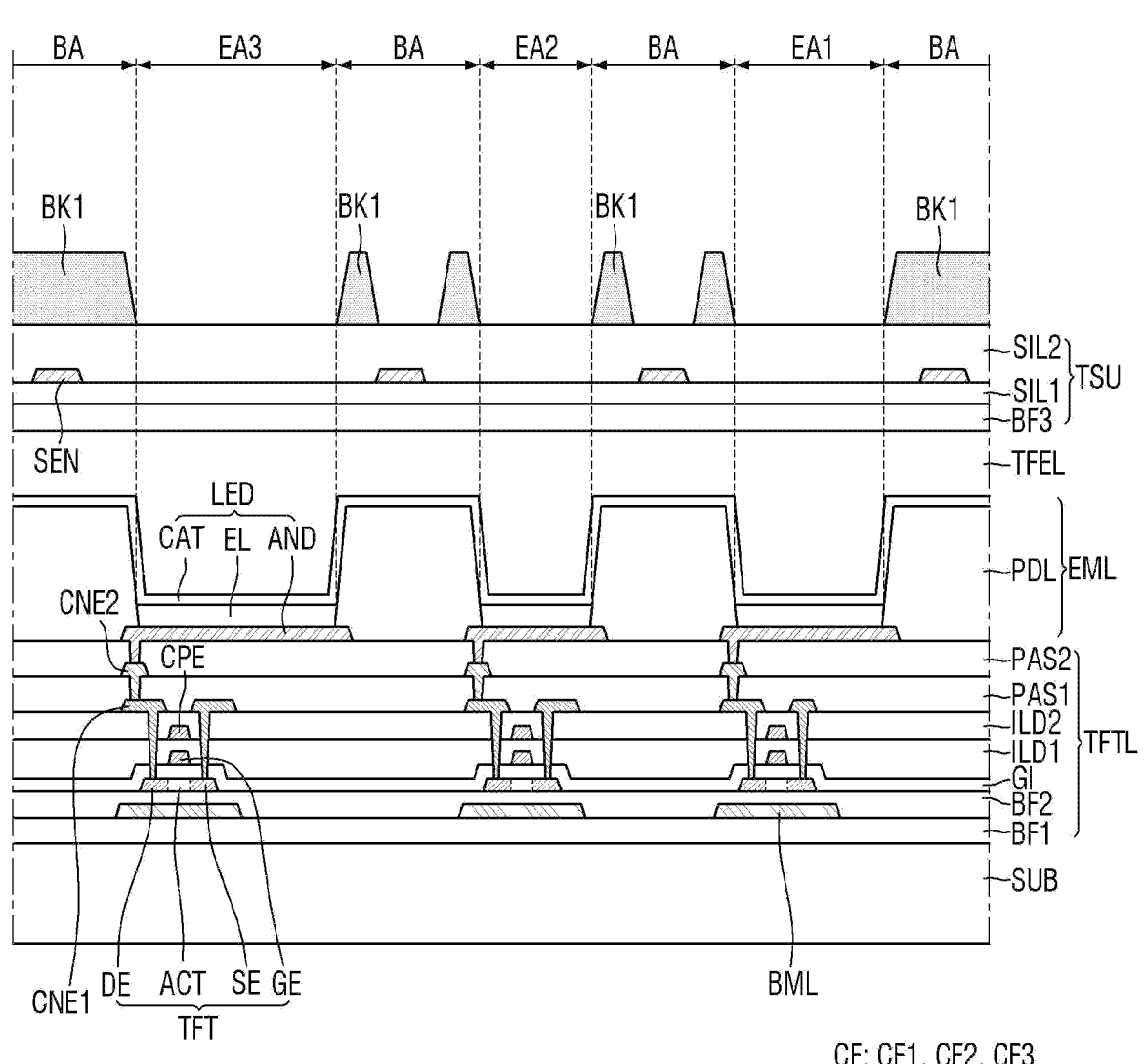

A mask MSK may be aligned on the layer BK1' for forming the first light blocking part BK1 (e.g., refer to FIG. 10). The mask MSK may include an opening OPN corresponding to a planar shape of the first to third emission areas EA1, EA2, and EA3 and the second light blocking part BK2 (e.g., refer to FIG. 11). The layer BK1' for forming the first light blocking part BK1 may be etched along a shape of the opening OPN of the mask MSK. For example, the layer BK1' for forming the first light blocking part BK1 may be etched through a laser etching, dry etching, or plasma etching process, but is not limited thereto.

In FIG. 10, a region of the layer BK1' (e.g., refer to FIG. 9) corresponding to the opening OPN of the mask MSK may be etched to form the first light blocking part BK1. For example, in the layer BK1' for forming the first light blocking part BK1, a region corresponding to the first to third emission areas EA1, EA2, and EA3 and a region where the second light blocking part BK2 is to be formed may be etched, and the second insulating layer SIL2 may be exposed through the etched region.

Figure 11:
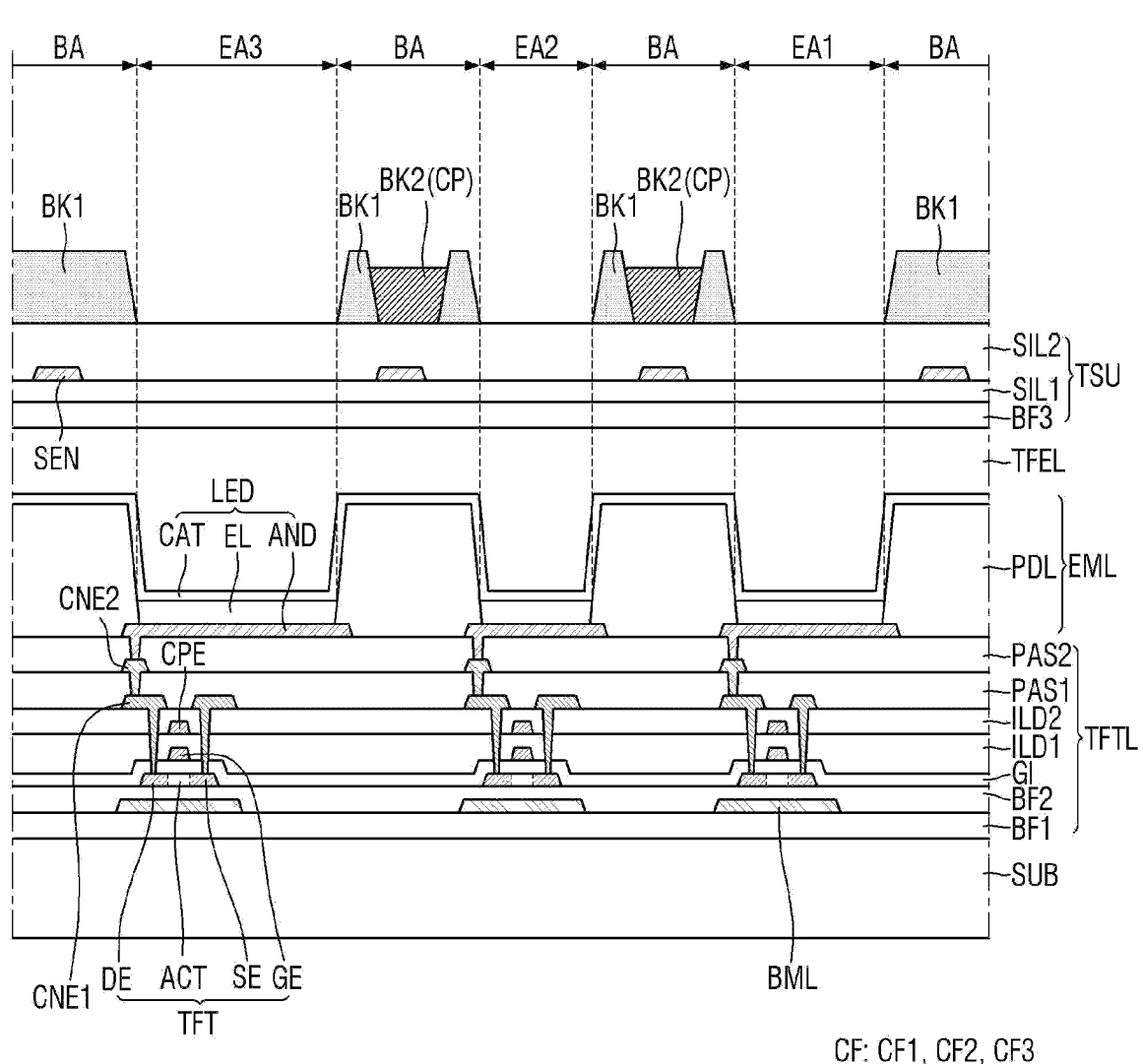

In FIG. 11, the second light blocking part BK2 may be formed in a part of the region where the first light blocking part BK1 has been etched. The second light blocking part BK2 may be formed in the region where the first light blocking part BK1 has been etched in the light blocking area BA. The height of the second light blocking part BK2 may be lower than the height of the first light blocking part BK1, but is not limited thereto. The second light blocking part BK2 may include a material different from that of the first light blocking part BK1. The second light blocking part BK2 may include an inorganic black pigment or an organic black pigment. For example, when the first light blocking part BK1 includes the organic black pigment, the second light blocking part BK2 may include the inorganic black pigment. As another example, when the first light blocking part BK1 includes the inorganic black pigment, the second light blocking part BK2 may include the organic black pigment.

The first and second light blocking parts BK1 and BK2 may have different light transmittances for a wavelength. For example, when the first light blocking part BK1 includes the organic black pigment and the second light blocking part BK2 includes the inorganic black pigment, the transmittance of the first light blocking part BK1 with respect to infrared light may be significantly higher than the transmittance of the second light blocking part BK2 with respect to the infrared light. The first light blocking part BK1 may transmit most of the infrared light, and the second light blocking part BK2 may absorb most of the infrared light. Accordingly, in case that an infrared camera photographs the color filter layer CFL, the second light blocking part BK2 may be distinguished from the first light blocking part BK1, and the code pattern CP may be determined by the planar shape of the second light blocking part BK2. Since the code pattern CP is photographed by the infrared camera, the image quality of the display device 10 may not be deteriorated.

Figure 12:
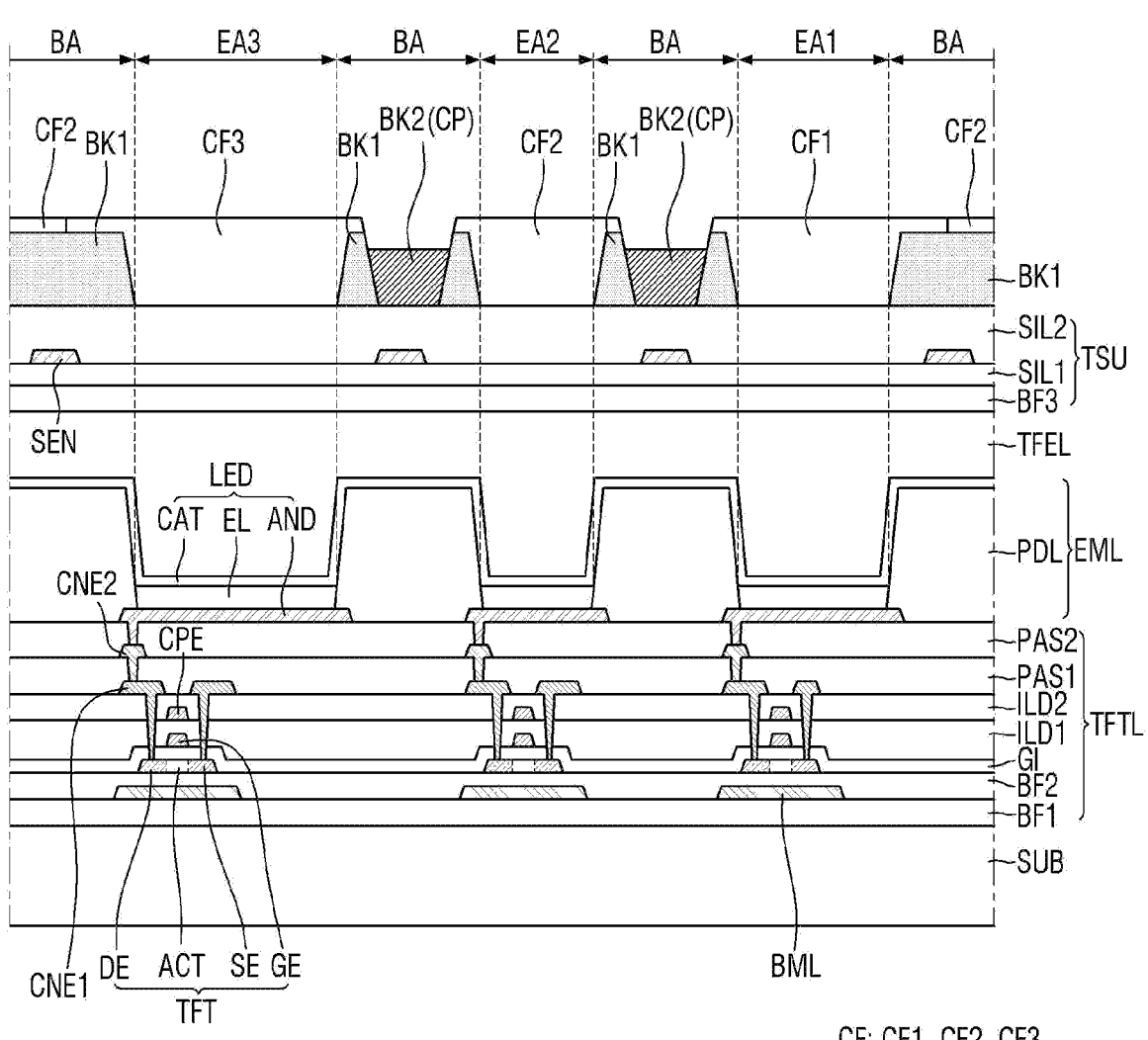

In FIG. 12, the first color filter CF1 may be formed in the first emission area EA1 in the region where the first light blocking part BK1 has been etched. The second color filter CF2 may be formed in the second emission area EA2 in the region where the first light blocking part BK1 has been etched. The third color filter CF3 may be formed in the third emission area EA3 in the region where the first light blocking part BK1 has been etched.

Each of the first to third color filters CF 1, CF2, and CF3 may be partially disposed on the first light blocking part BK1 in the light blocking area BA, but is not limited thereto. The first to third color filters CF 1, CF2, and CF3 may not overlap the second light blocking part BK2 in the thickness direction.

Figure 13:
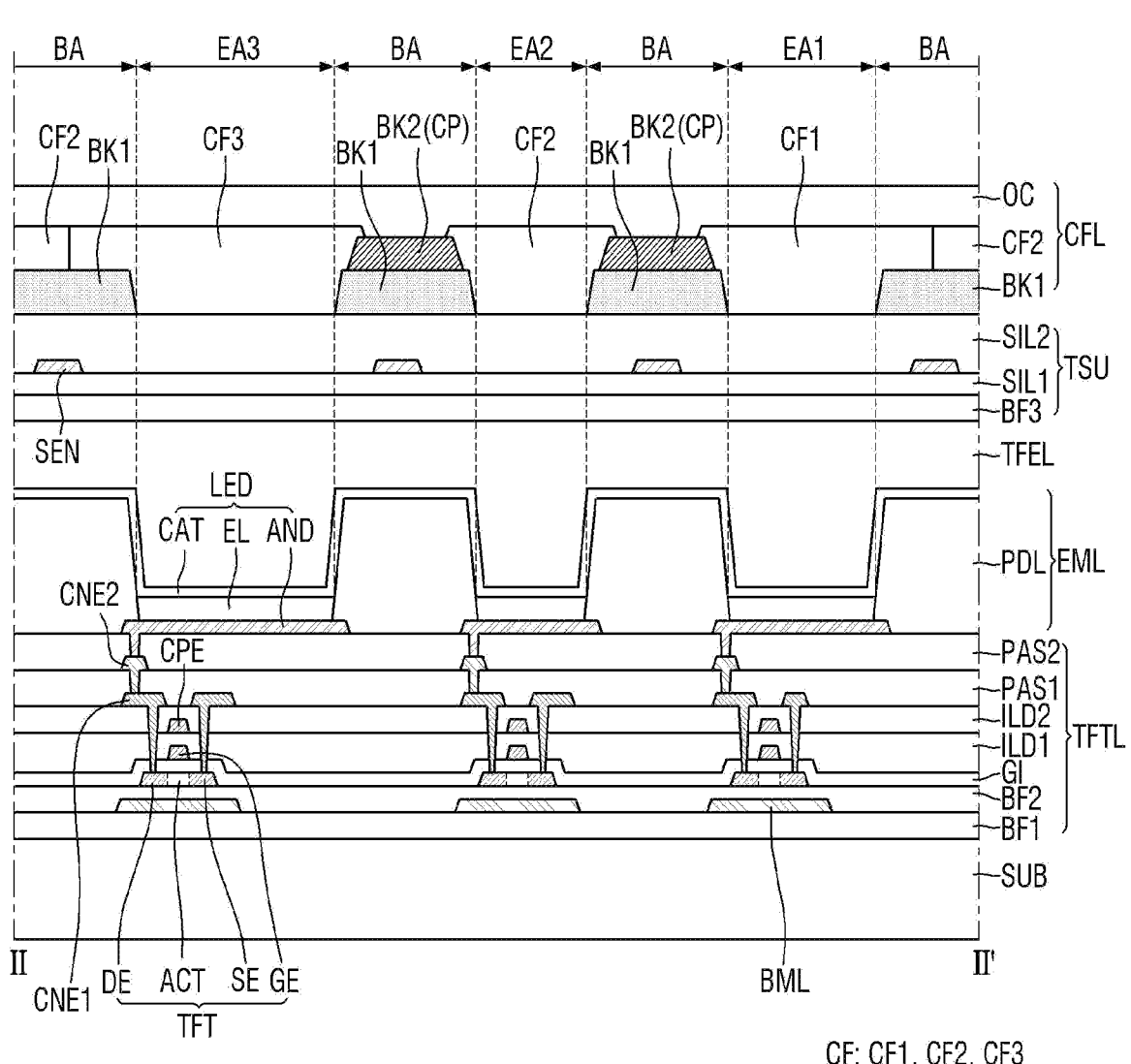
FIG. 13 is a schematic cross-sectional view of another example taken along line II-II' of FIG. 7.

FIG. 13 is a cross-sectional view of another example taken along line II-II' of FIG. 7. The display device of FIG. 13 differs from the display device of FIG. 8 in that the first and second light blocking parts BK1 and BK2 have different configurations. Thus, detailed description of the same constituent elements is omitted.

Referring to FIG. 13, a color filter layer CFL may be disposed on a touch sensing part TSU. The color filter layer CFL may include first and second light blocking parts BK1 and BK2, a code pattern CP, first to third color filters CF 1, CF2, and CF3, and a planarization layer OC.

The first light blocking part BK1 may be disposed on a second insulating layer SIL2 in a light blocking area BA. The first light blocking part BK1 may overlap a touch electrode SEN in a thickness direction to prevent light reflection by the touch electrode SEN. The first light blocking part BK1 may contain a light absorbing material. For example, the first light blocking part BK1 may include an inorganic black pigment or an organic black pigment. The inorganic black pigment of the first light blocking part BK1 may be carbon black, and the organic black pigment of the first light blocking part BK1 may include at least one of lactam black, perylene black, and aniline black, but the disclosure is not limited thereto. The first light blocking part BK1 may prevent visible light infiltration and color mixture between first to third emission areas EA1, EA2, and EA3. Thus, color reproducibility of the display device 10 may be improved.

The second light blocking part BK2 may be disposed on the first light blocking part BK1 in a part of the light blocking area BA. The second light blocking part BK2 may be surrounded by the first to third color filters CF 1, CF2, and CF3. A thickness of the second light blocking part BK2 may be the same as a thickness of the first light blocking part BK1, but the disclosure is not limited thereto. The second light blocking part BK2 may include a material different from that of the first light blocking part BK1. The second light blocking part BK2 may include an inorganic black pigment or an organic black pigment. For example, when the first light blocking part BK1 includes the organic black pigment, the second light blocking part BK2 may include the inorganic black pigment. As another example, when the first light blocking part BK1 includes the inorganic black pigment, the second light blocking part BK2 may include the organic black pigment.

The first and second light blocking parts BK1 and BK2 may have different light transmittances for a wavelength. For example, when the first light blocking part BK1 includes the organic black pigment and the second light blocking part BK2 includes the inorganic black pigment, the transmittance of the first light blocking part BK1 with respect to infrared light may be significantly higher than the transmittance of the second light blocking part BK2 with respect to the infrared light. The first light blocking part BK1 may transmit most of the infrared light, and the second light blocking part BK2 may absorb most of the infrared light. The first to third color filters CF 1, CF2, and CF3 may cover a part of a top surface of the second light blocking part BK2, and another part of the top surface of the second light blocking part BK2 may be exposed from the first to third color filters CF 1, CF2, and CF3 to form a code pattern CP. Accordingly, in case that an infrared camera photographs the color filter layer CFL, the second light blocking part BK2 may be distinguished from the first light blocking part BK1, and the code pattern CP may be determined by a planar shape of the second light blocking part BK2. Since the code pattern CP is photographed by the infrared camera, the image quality of the display device 10 may not be deteriorated.

Multiple code patterns CP may be disposed over a region (e.g., the entire region) of the color filter layer CFL, and each of the code patterns CP may have position information according to a criterion. The code pattern CP may be photographed by a camera approaching a front of the display device 10, and may be identified through a captured picture or image. At least one code pattern CP or a combination of the code patterns CP may correspond to a preset data code value. For example, the code pattern CP disposed at a position may correspond to a data code designated at the corresponding position.

FIGS. 14 to 17 are schematic cross-sectional views illustrating a manufacturing process of the display device of FIG. 13.

Figure 14:
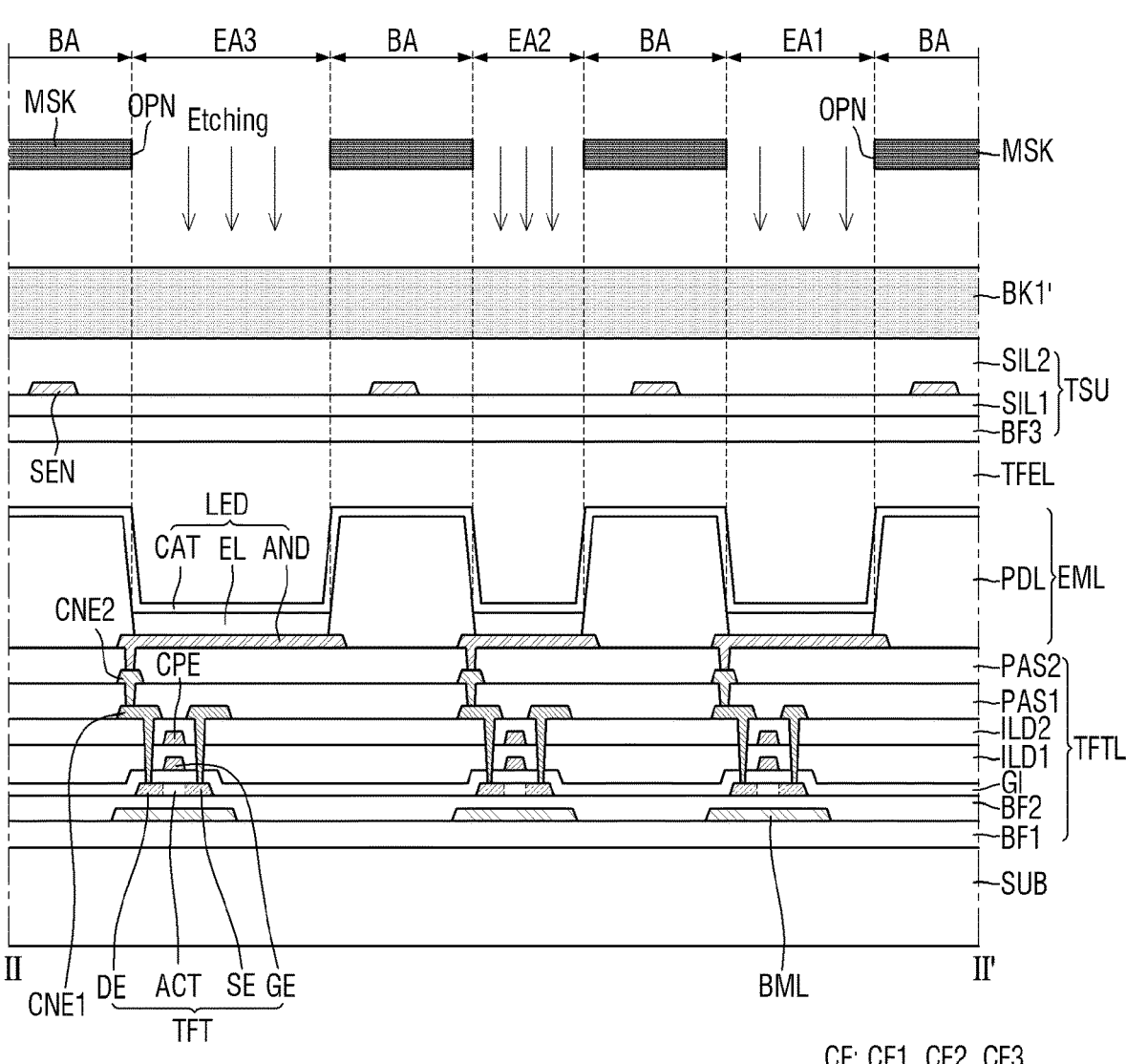
FIGS. 14 to 17 are schematic cross-sectional views illustrating a manufacturing process of the display device of FIG. 13.

In FIG. 14, the thin film transistor layer TFTL, the light emitting element layer EML, the encapsulation layer TFEL, and the touch sensing part TSU may be sequentially stacked on the substrate SUB.

A layer BK1' for forming the first light blocking part BK1 (e.g., refer to FIG. 15) may be formed on a surface (e.g., the entire surface) of the second insulating layer SIL2. The layer BK1' for forming the first light blocking part BK1 may contain a light absorbing material. For example, the layer BK1' for forming the first light blocking part BK1 may include an inorganic black pigment or an organic black pigment. The inorganic black pigment of the layer BK1' may be carbon black, and the organic black pigment of the layer BK1' may include at least one of lactam black, perylene black, and aniline black, but the disclosure is not limited thereto.

Figure 15:
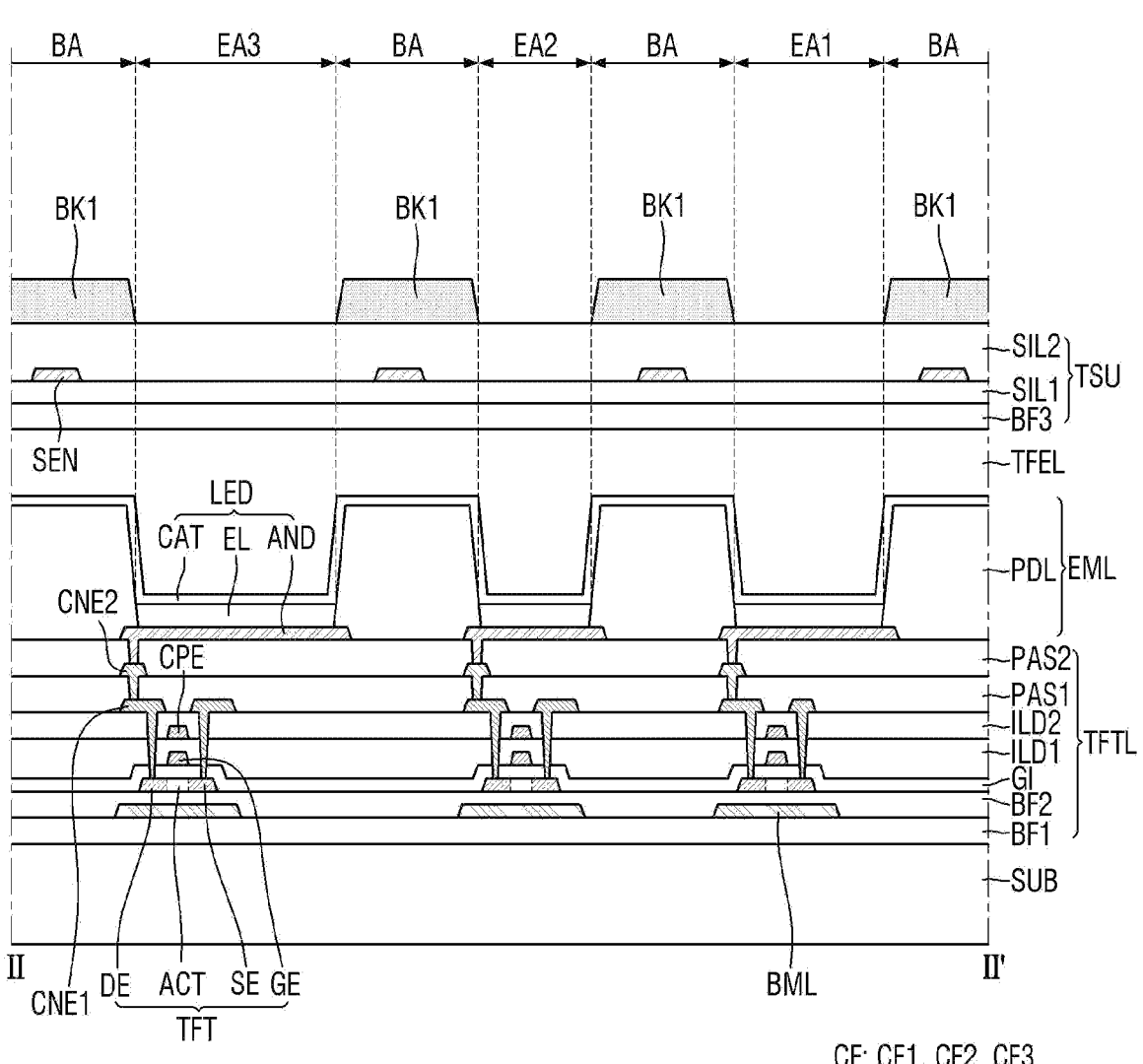

The mask MSK may be aligned on the layer BK1' for forming the first light blocking part BK1 (e.g., refer to FIG. 15). The mask MSK may include the opening OPN corresponding to the planar shape of the first to third emission areas EA1, EA2, and EA3. The layer BK1' for forming the first light blocking part BK1 may be etched along a shape of the opening OPN of the mask MSK. For example, the layer BK1' for forming the first light blocking part BK1 may be etched through a laser etching, dry etching, or plasma etching process, but is not limited thereto.

In FIG. 15, a region of the layer BK1' (e.g., refer to FIG. 14) corresponding to the opening OPN of the mask MSK may be etched to form the first light blocking part BK1. For example, a region of the layer BK1' for forming the first light blocking part BK1 corresponding to the first to third emission areas EA1, EA2, and EA3 may be etched, and the second insulating layer SIL2 may be exposed through the etched region.

Figure 16:
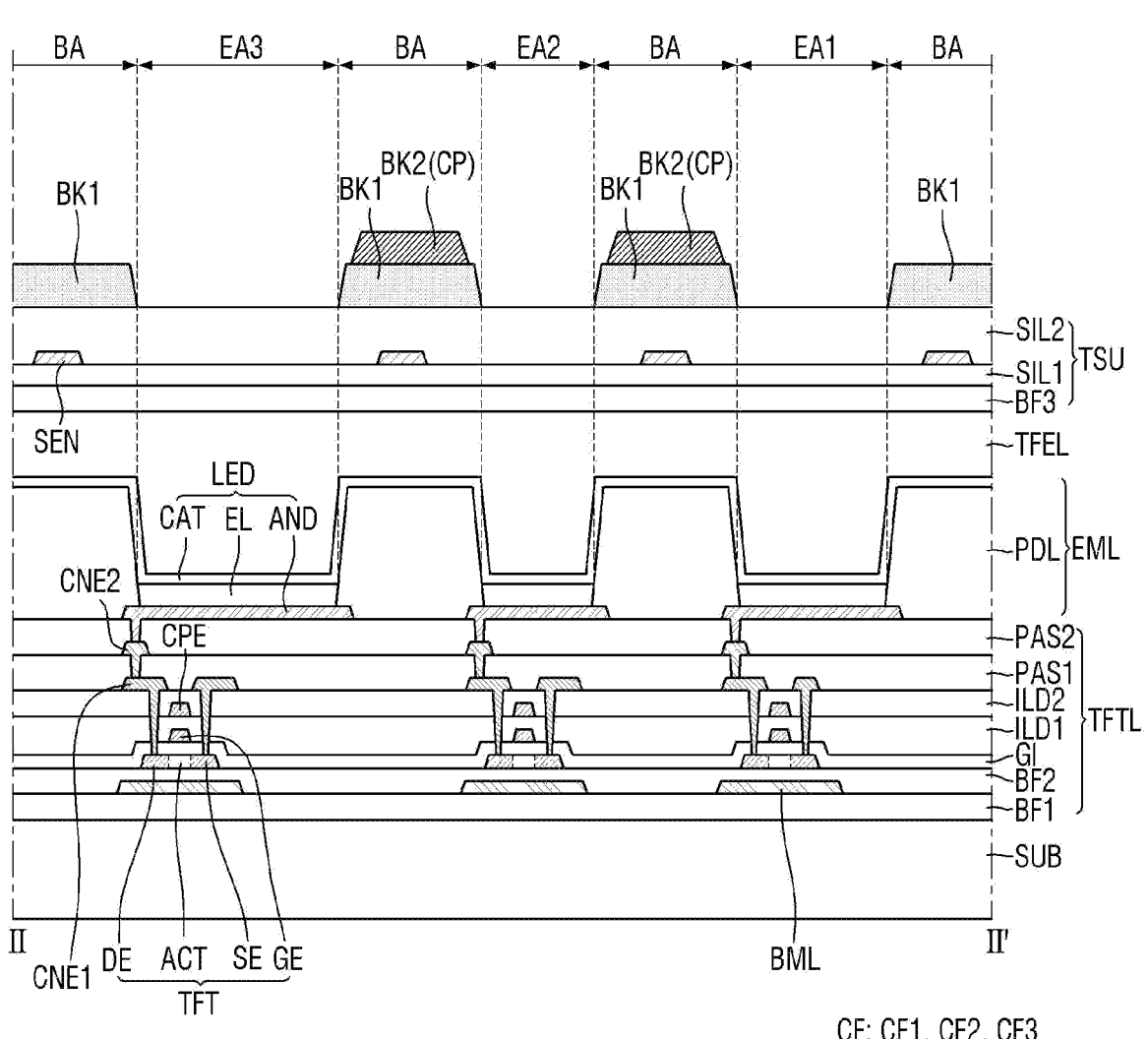

In FIG. 16, the second light blocking part BK2 may be formed on the first light blocking part BK1 in a part of the light blocking area BA. A thickness of the second light blocking part BK2 may be the same as a thickness of the first light blocking part BK1, but the disclosure is not limited thereto. The second light blocking part BK2 may include a material different from that of the first light blocking part BK1. The second light blocking part BK2 may include an inorganic black pigment or an organic black pigment. For example, when the first light blocking part BK1 includes the organic black pigment, the second light blocking part BK2 may include the inorganic black pigment. As another example, when the first light blocking part BK1 includes the inorganic black pigment, the second light blocking part BK2 may include the organic black pigment.

The first and second light blocking parts BK1 and BK2 may have different light transmittances for a wavelength. For example, when the first light blocking part BK1 includes the organic black pigment and the second light blocking part BK2 includes the inorganic black pigment, the transmittance of the first light blocking part BK1 with respect to infrared light may be significantly higher than the transmittance of the second light blocking part BK2 with respect to the infrared light. The first light blocking part BK1 may transmit most of the infrared light, and the second light blocking part BK2 may absorb most of the infrared light. The first to third color filters CF 1, CF2, and CF3 may cover a part of a top surface of the second light blocking part BK2, and another part of the top surface of the second light blocking part BK2 may be exposed from the first to third color filters CF 1, CF2, and CF3 to form a code pattern CP. Accordingly, in case that an infrared camera photographs the color filter layer CFL, the second light blocking part BK2 may be distinguished from the first light blocking part BK1, and the code pattern CP may be determined by a planar shape of the second light blocking part BK2. Since the code pattern CP is photographed by the infrared camera, the image quality of the display device 10 may not be deteriorated.

Figure 17:
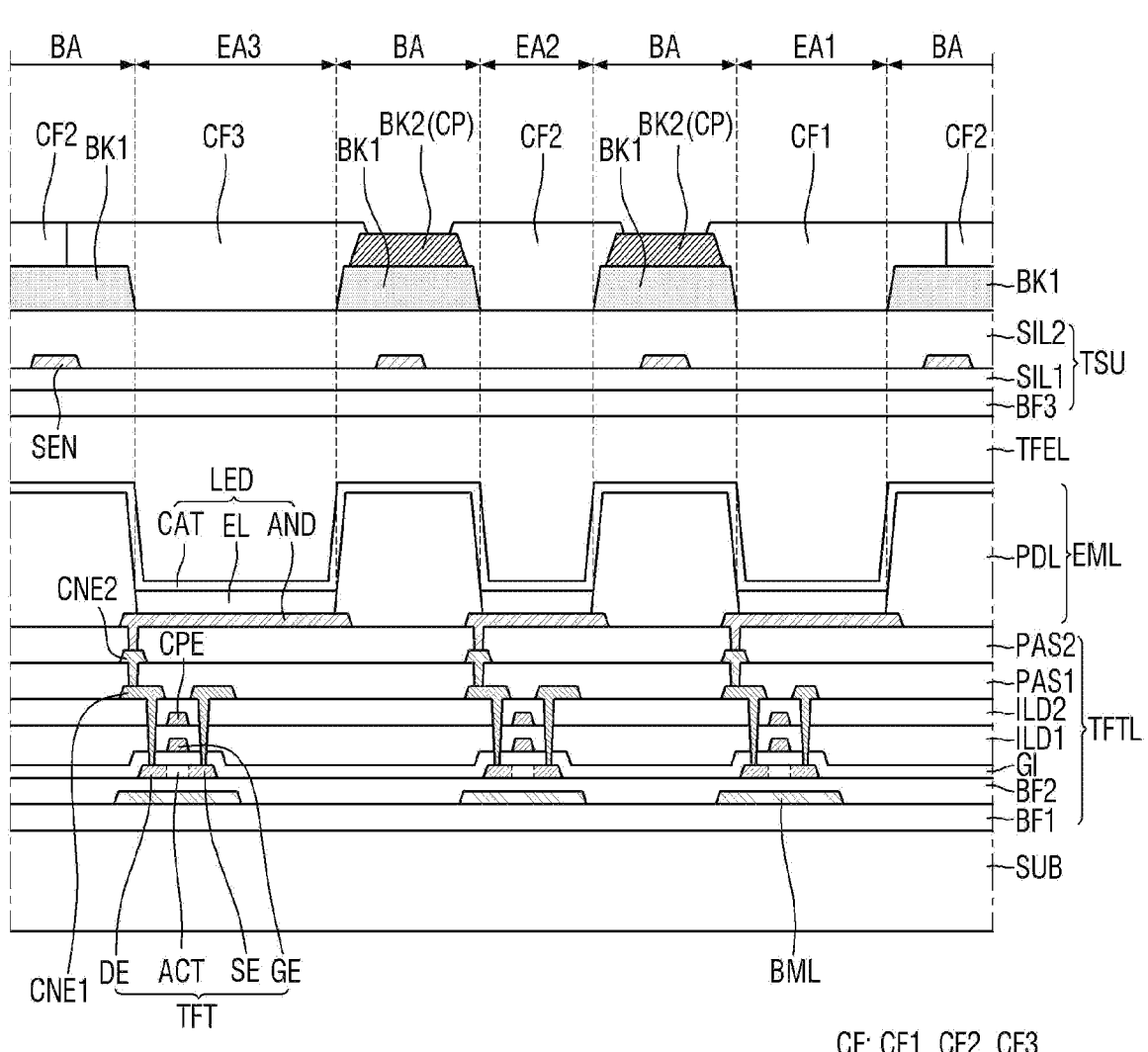

In FIG. 17, the first color filter CF1 may be formed in the first emission area EA1 in the region where the first light blocking part BK1 has been etched. The second color filter CF2 may be formed in the second emission area EA2 in the region where the first light blocking part BK1 has been etched. The third color filter CF3 may be formed in the third emission area EA3 in the region where the first light blocking part BK1 has been etched.

Figure 18:
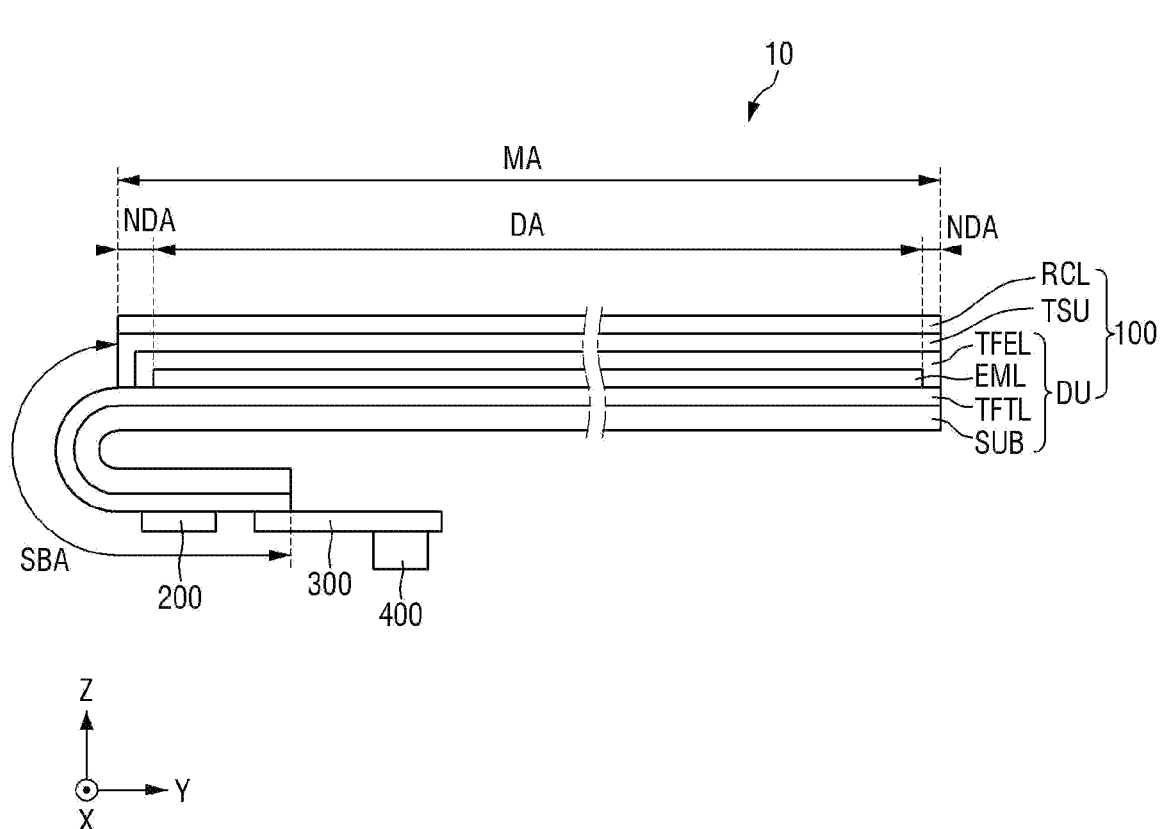
FIG. 18 is a schematic cross-sectional view showing a display device according to another embodiment.

FIG. 18 is a schematic cross-sectional view showing a display device according to another embodiment. The display device of FIG. 18 has the same elements as the display device of FIG. 2 except an anti-reflection layer. Thus, detailed description of the same constituent elements is omitted.

Referring to FIG. 18, the display panel 100 may include a display part DU, a touch sensing part TSU, and an anti-reflection layer RCL. The display part DU may include a substrate SUB, a thin film transistor layer TFTL, a light emitting element layer EML, and an encapsulation layer TFEL.

The anti-reflection layer RCL may be disposed on a touch sensing part TSU. The anti-reflection layer RCL may prevent reflection of external light. Thus, a decrease in visibility caused by the reflection of external light may be reduced. The anti-reflection layer RCL may protect a top surface of the display device 10.

Figure 19:
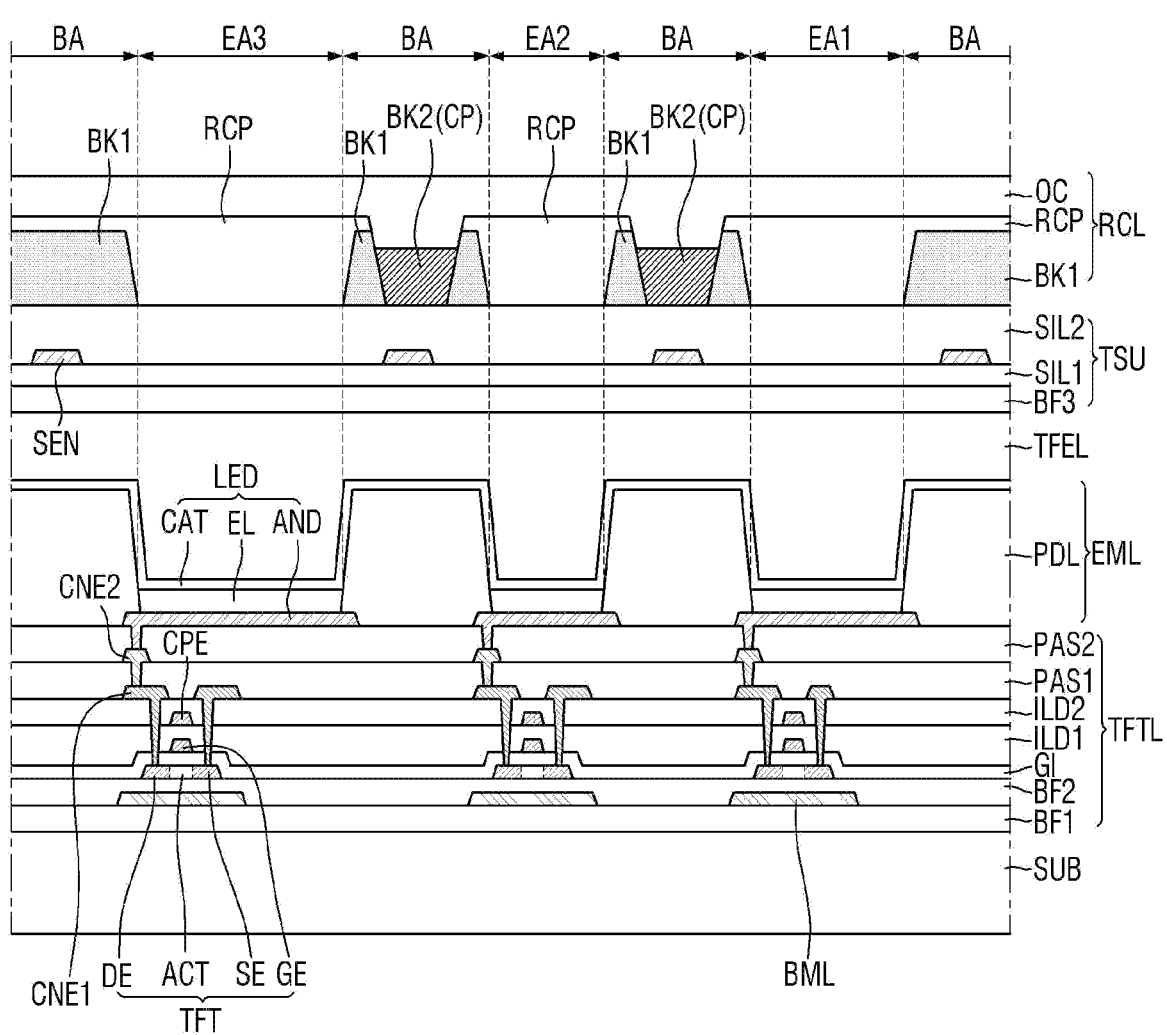
FIG. 19 is a schematic cross-sectional view illustrating an example of an anti-reflection layer in a display device according to another embodiment.

FIG. 19 is a schematic cross-sectional view illustrating an example of an anti-reflection layer in a display device according to another embodiment. The display device of FIG. 19 has the same elements as the display device of FIG. 8 except an anti-reflection portion. Thus, detailed description of the same constituent elements is omitted.

Referring to FIG. 19, an anti-reflection layer RCL may be disposed on a touch sensing part TSU. The anti-reflection layer RCL may include first and second light blocking parts BK1 and BK2, a code pattern CP, an anti-reflection portion RCP, and a planarization layer OC.

The first light blocking part BK1 may be disposed on a second insulating layer SIL2 in a light blocking area BA. The first light blocking part BK1 may overlap a touch electrode SEN in the thickness direction to prevent light reflection by the touch electrode SEN. The first light blocking part BK1 may contain a light absorbing material. For example, the first light blocking part BK1 may include an inorganic black pigment or an organic black pigment. The inorganic black pigment of the first light blocking part BK1 may be carbon black, and the organic black pigment of the first light blocking part BK1 may include at least one of lactam black, perylene black, and aniline black, but the disclosure is not limited thereto. The first light blocking part BK1 may prevent visible light infiltration and color mixture between first to third emission areas EA1, EA2, and EA3. Thus, color reproducibility of the display device 10 may be improved.

The second light blocking part BK2 may be disposed on the second insulating layer SIL2 in a part of the light blocking area BA. The second light blocking part BK2 may be surrounded by the first light blocking part BK1. The second light blocking part BK2 may be formed in a region formed by etching a part of the first light blocking part BK1. A height of the second light blocking part BK2 may be lower than a height of the first light blocking part BK1, but is not limited thereto. The second light blocking part BK2 may overlap the touch electrode SEN in the thickness direction to prevent light reflection by the touch electrode SEN. The second light blocking part BK2 may include a material different from that of the first light blocking part BK1. The second light blocking part BK2 may include an inorganic black pigment or an organic black pigment. For example, when the first light blocking part BK1 includes the organic black pigment, the second light blocking part BK2 may include the inorganic black pigment. As another example, when the first light blocking part BK1 includes the inorganic black pigment, the second light blocking part BK2 may include the organic black pigment.

The first and second light blocking parts BK1 and BK2 may have different light transmittances for a wavelength. For example, when the first light blocking part BK1 includes the organic black pigment and the second light blocking part BK2 includes the inorganic black pigment, a transmittance of the first light blocking part BK1 with respect to infrared light may be significantly higher than a transmittance of the second light blocking part BK2 with respect to the infrared light. The first light blocking part BK1 may transmit most of the infrared light, and the second light blocking part BK2 may absorb most of the infrared light. Accordingly, in case that an infrared camera photographs the anti-reflection layer RCL, the second light blocking part BK2 may be distinguished from the first light blocking part BK1, and the code pattern CP may be determined by a planar shape of the second light blocking part BK2. Since the code pattern CP is photographed by the infrared camera, the image quality of the display device 10 may not be deteriorated.

Multiple code patterns CP may be disposed over a region (e.g., the entire region) of the anti-reflection layer RCL, and each of the code patterns CP may have position information according to a criterion. The code pattern CP may be photographed by a camera approaching a front of the display device 10, and may be identified through a captured picture or image. At least one code pattern CP or a combination of the code patterns CP may correspond to a preset data code value. For example, the code pattern CP disposed at a position may correspond to a data code designated at the corresponding position.

The anti-reflection portion RCP may be disposed on the second insulating layer SIL2 in the first to third emission areas EA1, EA2, and EA3. The anti-reflection portion RCP may be disposed on the first light blocking part BK1 in the light blocking area BA and may not overlap the second light blocking part BK2 in the thickness direction. The anti-reflection portion RCP may transmit light of a first color (e.g., red), light of a second color (e.g., green), and light of a third color (e.g., blue). The anti-reflection portion RCP may prevent reflection of external light, thereby reducing a decrease in visibility due to the reflection of the external light.

The planarization layer OC may be disposed on the anti-reflection portion RCP and the second light blocking part BK2 to planarize an upper end of the anti-reflection layer RCL. For example, the planarization layer OC may include an organic material.

Figure 20:
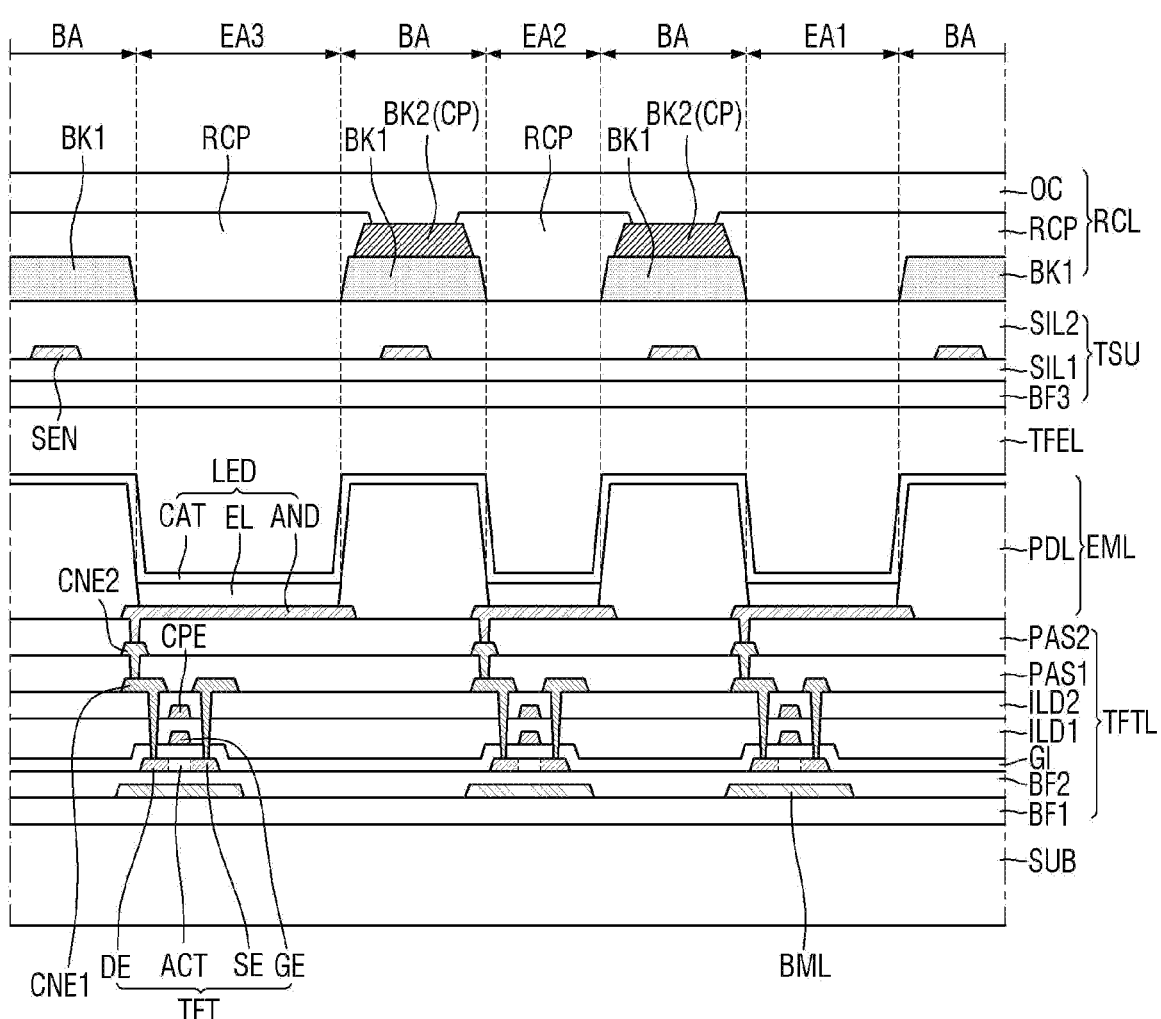
FIG. 20 is a schematic cross-sectional view illustrating another example of an anti-reflection layer in a display device according to another embodiment.

FIG. 20 is a schematic cross-sectional view illustrating another example of an anti-reflection layer in a display device according to another embodiment. The display device of FIG. 20 differs from the display device of FIG. 19 in that the first and second light blocking parts BK1 and BK2 have different configurations from each other. Thus, detailed description of the same constituent elements is omitted.

Referring to FIG. 20, an anti-reflection layer RCL may be disposed on a touch sensing part TSU. The anti-reflection layer RCL may include first and second light blocking parts BK1 and BK2, a code pattern CP, the anti-reflection portion RCP, and a planarization layer OC.

The first light blocking part BK1 may be disposed on a second insulating layer SIL2 in a light blocking area BA. The first light blocking part BK1 may overlap a touch electrode SEN in a thickness direction to prevent light reflection by the touch electrode SEN. The first light blocking part BK1 may contain a light absorbing material. For example, the first light blocking part BK1 may include an inorganic black pigment or an organic black pigment. The inorganic black pigment of the first light blocking part BK1 may be carbon black, and the organic black pigment of the first light blocking part BK1 may include at least one of lactam black, perylene black, and aniline black, but the disclosure is not limited thereto. The first light blocking part BK1 may prevent visible light infiltration and color mixture between first to third emission areas EA1, EA2, and EA3. Thus, color reproducibility of the display device 10 may be improved.

The second light blocking part BK2 may be disposed on the first light blocking part BK1 in a part of the light blocking area BA. The second light blocking part BK2 may be surrounded by first to third color filters CF1, CF2, and CF3. A thickness of the second light blocking part BK2 may be the same as a thickness of the first light blocking part BK1, but the disclosure is not limited thereto. The second light blocking part BK2 may include a material different from that of the first light blocking part BK1. The second light blocking part BK2 may include an inorganic black pigment or an organic black pigment. For example, when the first light blocking part BK1 includes the organic black pigment, the second light blocking part BK2 may include the inorganic black pigment. As another example, when the first light blocking part BK1 includes the inorganic black pigment, the second light blocking part BK2 may include the organic black pigment.

The first and second light blocking parts BK1 and BK2 may have different light transmittances for a wavelength. For example, when the first light blocking part BK1 includes the organic black pigment and the second light blocking part BK2 includes the inorganic black pigment, the transmittance of the first light blocking part BK1 with respect to infrared light may be significantly higher than the transmittance of the second light blocking part BK2 with respect to the infrared light. The first light blocking part BK1 may transmit most of the infrared light, and the second light blocking part BK2 may absorb most of the infrared light. The anti-reflection portion RCP may cover a part of a top surface of the second light blocking part BK2, and another part of the top surface of the second light blocking part BK2 may be exposed from the anti-reflection portion RCP to form the code pattern CP. Accordingly, in case that an infrared camera photographs the anti-reflection layer RCL, the second light blocking part BK2 may be distinguished from the first light blocking part BK1, and the code pattern CP may be determined by a planar shape of the second light blocking part BK2. Since the code pattern CP is photographed by the infrared camera, the image quality of the display device 10 may not be deteriorated.

Multiple code patterns CP may be disposed over a region (e.g., the entire region) of the anti-reflection layer RCL, and each of the code patterns CP may have position information according to a criterion. The code pattern CP may be photographed by a camera approaching a front of the display device 10, and may be identified through a captured picture or image. At least one code pattern CP or a combination of the code patterns CP may correspond to a preset data code value. For example, the code pattern CP disposed at a position may correspond to a data code designated at the corresponding position.

Figure 21:
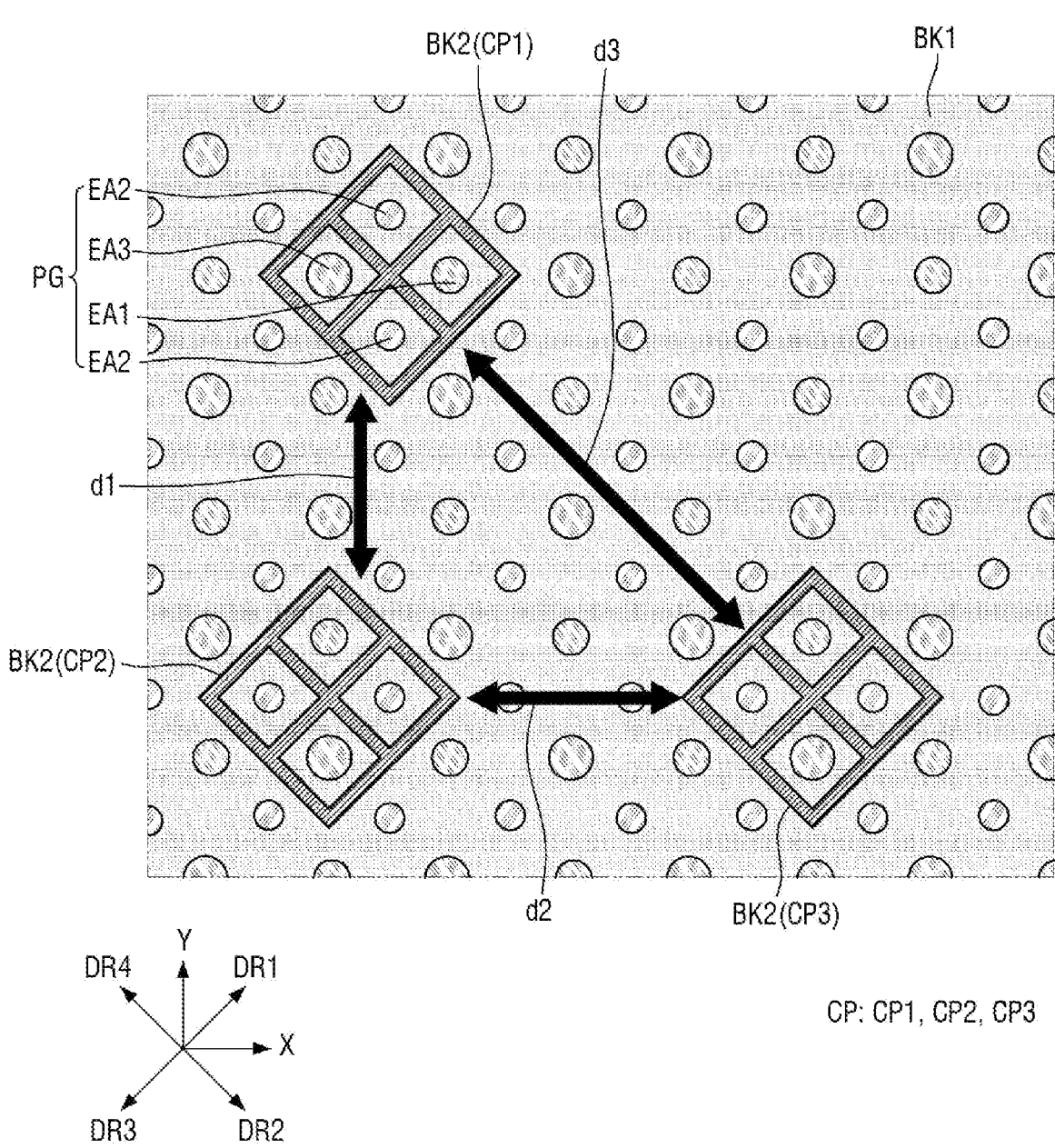
FIG. 21 is a schematic plan view illustrating an example of a code pattern in a display device according to an embodiment.

FIG. 21 is a schematic plan view illustrating an example of a code pattern in a display device according to an embodiment.

Referring to FIG. 21, a code pattern CP may be determined by a planar shape of a second light blocking part BK2. The code pattern CP may surround at least one of first to third emission areas EA1, EA2, and EA3. The code pattern CP may be formed in a mesh structure or a net structure in a plan view. For example, the code pattern CP may surround a first emission area EA1 (e.g., one first emission area EA1), two second emission areas EA2, and a third emission area EA3 (e.g., one third emission area EA3) forming each pixel group PG, but is not limited thereto. The code pattern CP may not overlap the first to third emission areas EA1, EA2, and EA3 in a thickness direction. Accordingly, the display device 10 may prevent luminance of light emitted from the first to third emission areas EA1, EA2, and EA3 from being reduced by the second light blocking part BK2 or the code pattern CP.

The code pattern CP may include first to third code patterns CP1, CP2, and CP3. The first and second code patterns CP1 and CP2 may be spaced apart from each other by a first distance d1. The second and third code patterns CP2 and CP3 may be spaced apart from each other by a second distance d2. The third and first code patterns CP3 and CP1 may be spaced apart from each other by a third distance d3. For example, the code pattern CP may have position information according to a planar shape of the first to third code patterns CP1, CP2, and CP3 or the first to third distances d1, d2, and d3, but is not limited thereto. The code pattern CP may be photographed by a camera approaching a front of the display device 10, and may be identified through a captured picture or image. A combination of the first to third code patterns CP1, CP2, and CP3 may correspond to a preset data code value. For example, a combination of the first to third code patterns CP1, CP2, and CP3 disposed at a position may correspond to a data code designated at the corresponding position.

Figure 22:
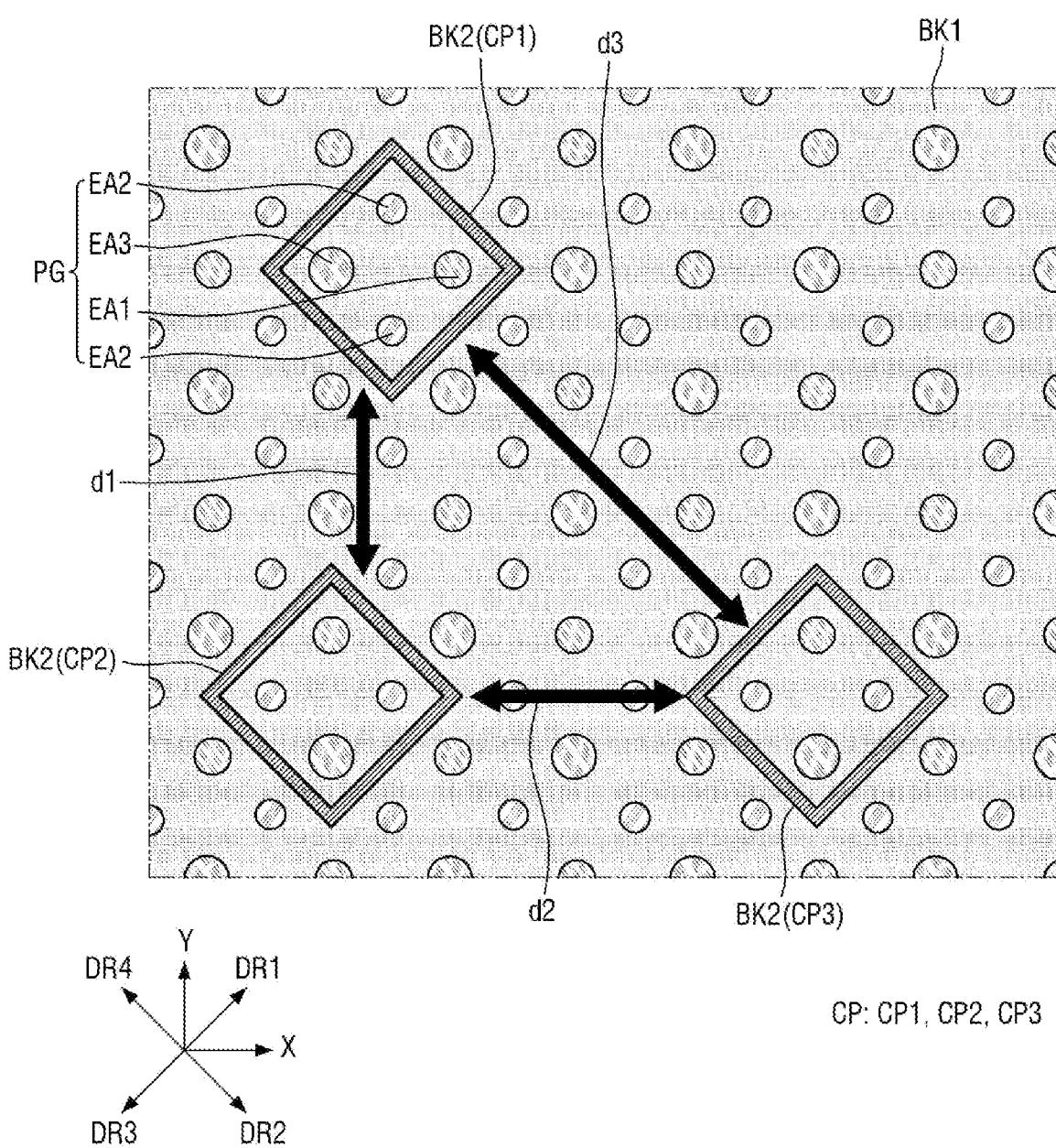
FIG. 22 is a schematic plan view illustrating another example of a code pattern in a display device according to an embodiment.

FIG. 22 is a schematic plan view illustrating another example of a code pattern in a display device according to an embodiment.

Referring to FIG. 22, a code pattern CP may be determined by a planar shape of a second light blocking part BK2. The code pattern CP may surround at least one of first to third emission areas EA1, EA2, and EA3. For example, the code pattern CP may surround a pixel group PG, but is not limited thereto.

The code pattern CP may include first to third code patterns CP1, CP2, and CP3. The first and second code patterns CP1 and CP2 may be spaced apart from each other by a first distance d1. The second and third code patterns CP2 and CP3 may be spaced apart from each other by a second distance d2. The third and first code patterns CP3 and CP1 may be spaced apart from each other by a third distance d3. For example, the code pattern CP may have position information according to a planar shape of the first to third code patterns CP1, CP2, and CP3 or first to third distances d1, d2, and d3, but is not limited thereto.

Figure 23:
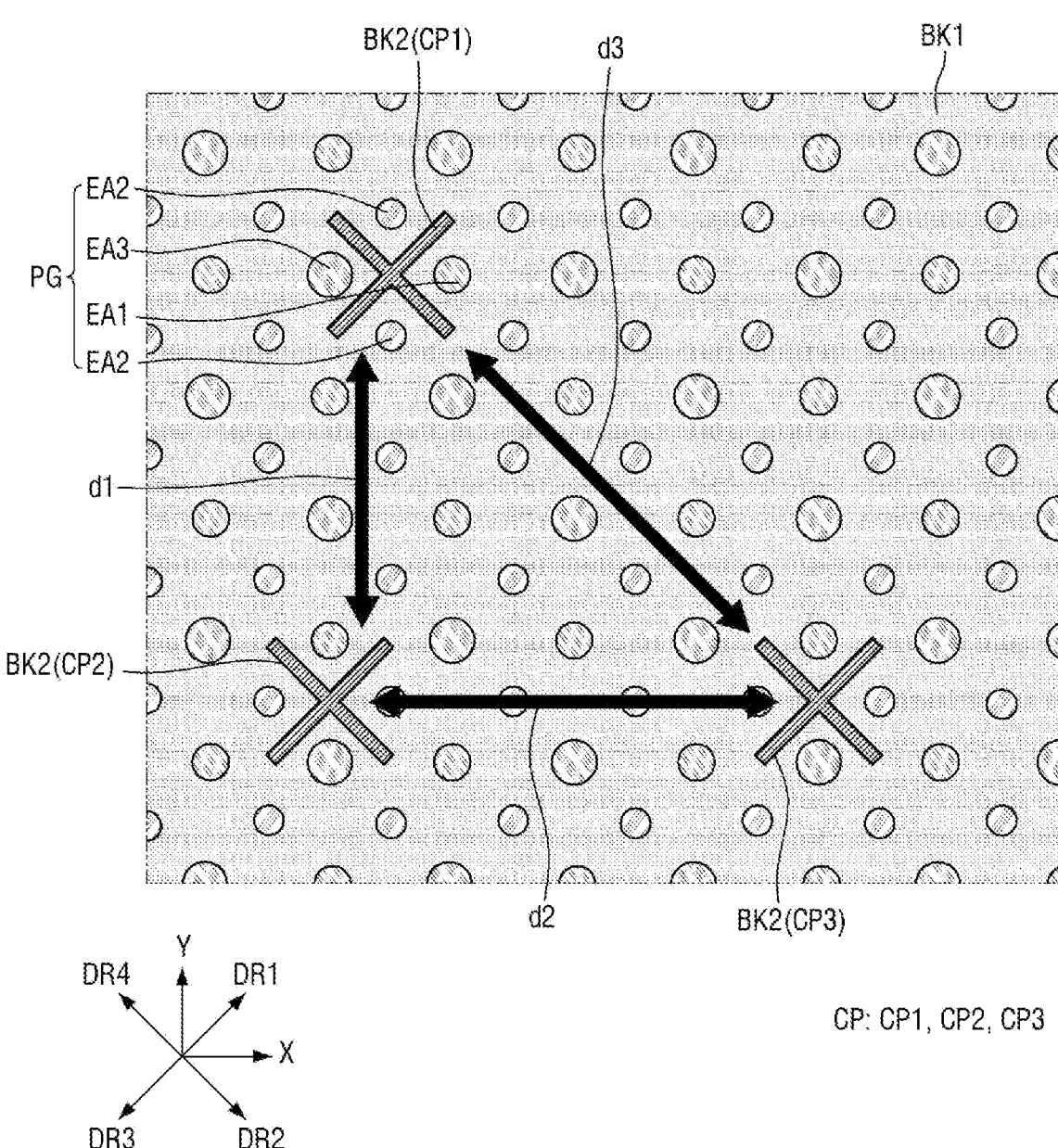
FIG. 23 is a schematic plan view illustrating still another example of a code pattern in a display device according to an embodiment.

FIG. 23 is a schematic plan view illustrating still another example of a code pattern in a display device according to an embodiment.

Referring to FIG. 23, a code pattern CP may be determined by a planar shape of second light blocking part BK2. The code pattern CP may be disposed between first to third emission areas EA1, EA2, and EA3. For example, the code pattern CP may be formed of a first portion extending in a first direction DR1 and a second portion extending in a second direction DR2 that intersect each other.

The code pattern CP may include first to third code patterns CP1, CP2, and CP3. The first and second code patterns CP1 and CP2 may be spaced apart from each other by a first distance d1. The second and third code patterns CP2 and CP3 may be spaced apart from each other by a second distance d2. The third and first code patterns CP3 and CP1 may be spaced apart from each other by a third distance d3. For example, the code pattern CP may have position information according to a planar shape of the first to third code patterns CP1, CP2, and CP3 or the first to third distances d1, d2, and d3, but is not limited thereto.

Figure 24:
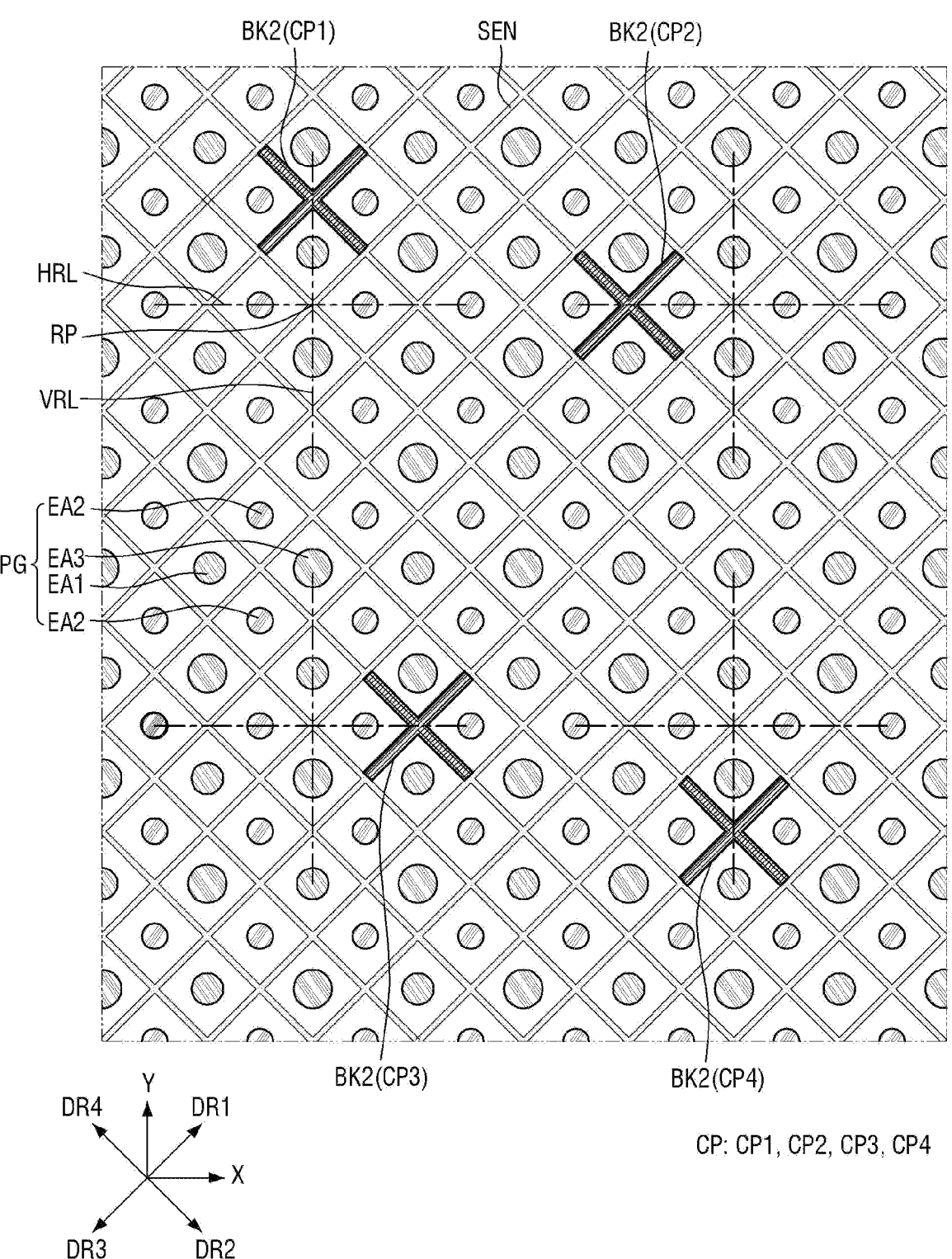
FIG. 24 is a schematic plan view illustrating still another example of a code pattern in a display device according to an embodiment.

FIG. 24 is a schematic plan view illustrating still another example of a code pattern in a display device according to an embodiment.

Referring to FIG. 24, a touch electrode SEN may be formed in a mesh structure or a net structure in a plan view. A second light blocking part BK2 may be disposed on the touch electrode SEN, and a code pattern CP may be determined by a planar shape of the second light blocking part BK2. The code pattern CP may be formed of a first portion extending in a first direction DR1 and a second portion extending in a second direction DR2 that cross (or intersect) each other. The code pattern CP may be disposed to a side of a reference point RP. A reference point RP may correspond to an intersection point between a horizontal line HRL extending in an X-axis direction and a vertical line VRL extending in a Y-axis direction. The reference point RP may overlap the touch electrode SEN in a thickness direction. For example, the code pattern CP may be disposed to upper, lower, left, or right side of the reference point RP, but is not limited thereto. The code pattern CP may not overlap first to third emission areas EA1, EA2, and EA3 in the thickness direction. Accordingly, the display device 10 may prevent luminance of light emitted from the first to third emission areas EA1, EA2, and EA3 from being reduced by the second light blocking part BK2 or the code pattern CP.

The code pattern CP may include first to fourth code patterns CP1, CP2, CP3, and CP4. The first code pattern CP1 may be disposed to the upper side of the reference point RP, and the second code pattern CP2 may be disposed to the left side of the reference point RP. The third code pattern CP3 may be disposed to the right side of the reference point RP, and the fourth code pattern CP4 may be disposed to the lower side of the reference point RP. For example, the code pattern CP may have position information according to a planar shape of the first to fourth code patterns CP1, CP2, CP3, and CP4 or the relative positions of the first to fourth code patterns CP1, CP2, CP3, and CP4 with respect to the reference point RP, but is not limited thereto. The code pattern CP may be photographed by a camera approaching a front of the display device 10, and may be identified through a captured picture or image. A combination of at least some of the first to fourth code patterns CP1, CP2, CP3, and CP4 may correspond to a preset data code value. For example, a combination of at least some of the first to fourth code patterns CP1, CP2, CP3, and CP4 disposed at a position may correspond to a data code designated at the corresponding position.

Figure 25:
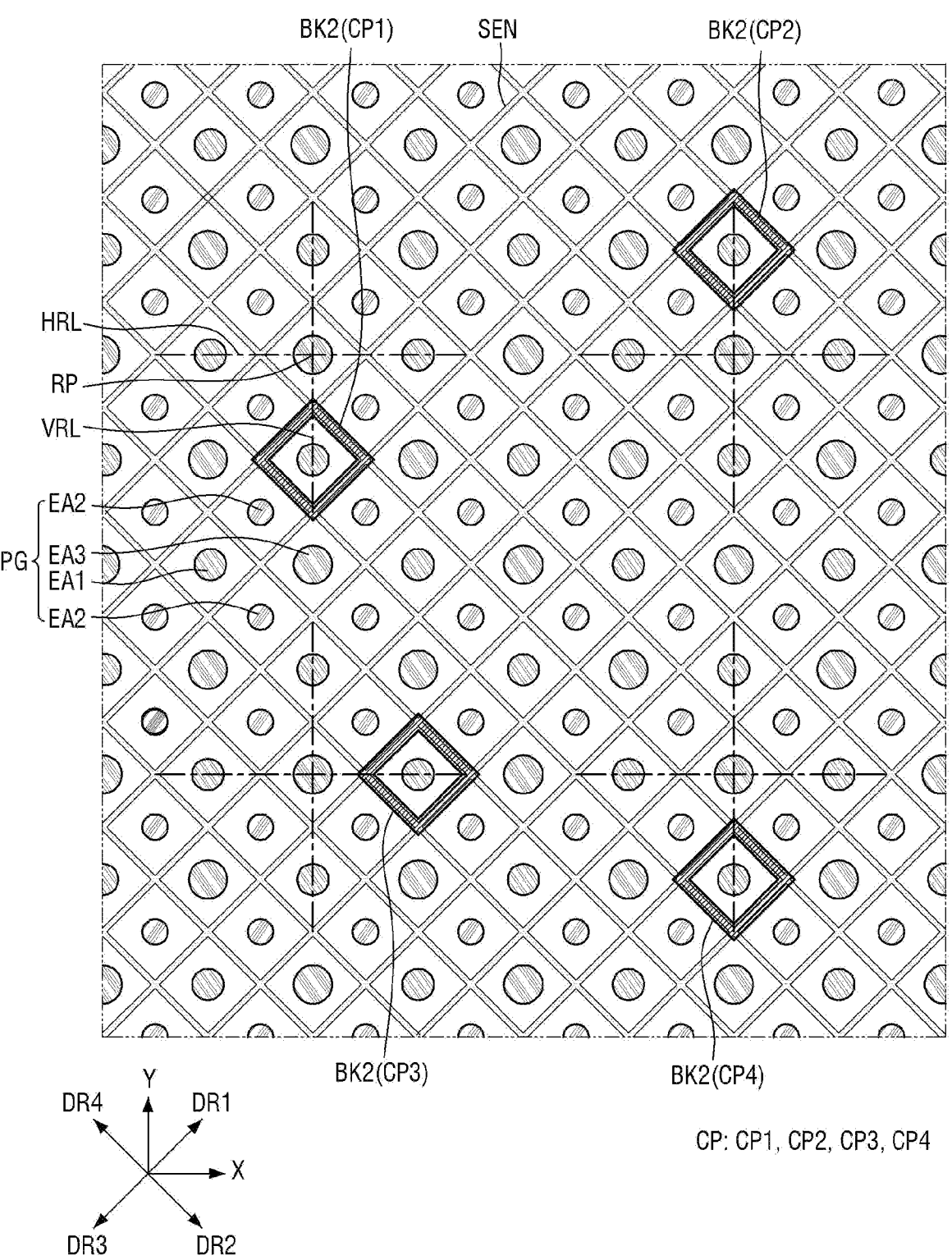
FIG. 25 is a schematic plan view illustrating still another example of a code pattern in a display device according to an embodiment.

FIG. 25 is a schematic plan view illustrating still another example of a code pattern in a display device according to an embodiment.

Referring to FIG. 25, a touch electrode SEN may be formed in a mesh structure or a net structure in a plan view. A second light blocking part BK2 may be disposed on the touch electrode SEN, and a code pattern CP may be determined by a planar shape of a second light blocking part BK2. The code pattern CP may surround one of first to third emission areas EA1, EA2, and EA3. The code pattern CP may be disposed to a side of a reference point RP. The reference point RP may correspond to an intersection point between a horizontal line HRL extending in an X-axis direction and a vertical line VRL extending in a Y-axis direction. The reference point RP may overlap one of the first to third emission areas EA1, EA2, and EA3 in a thickness direction. For example, the code pattern CP may be disposed to upper, lower, left, or right side of the reference point RP, but is not limited thereto. The code pattern CP may not overlap the first to third emission areas EA1, EA2, and EA3 in the thickness direction. Accordingly, the display device 10 may prevent luminance of light emitted from the first to third emission areas EA1, EA2, and EA3 from being reduced by the second light blocking part BK2 or the code pattern CP.

The code pattern CP may include first to fourth code patterns CP1, CP2, CP3, and CP4. The first code pattern CP1 may be disposed to the lower side of the reference point RP, and the second code pattern CP2 may be disposed to the upper side of the reference point RP. The third code pattern CP3 may be disposed to the right side of the reference point RP, and the fourth code pattern CP4 may be disposed to the lower side of the reference point RP. For example, the code pattern CP may have position information according to a planar shape of the first to fourth code patterns CP1, CP2, CP3, and CP4 or relative positions of the first to fourth code patterns CP1, CP2, CP3, and CP4 with respect to the reference point RP, but is not limited thereto. The code pattern CP may be photographed by a camera approaching a front of the display device 10, and may be identified through a captured picture or image. A combination of at least some of the first to fourth code patterns CP1, CP2, CP3, and CP4 may correspond to a preset data code value. For example, a combination of at least some of the first to fourth code patterns CP1, CP2, CP3, and CP4 disposed at a position may correspond to a data code designated at the corresponding position.

Figure 26:
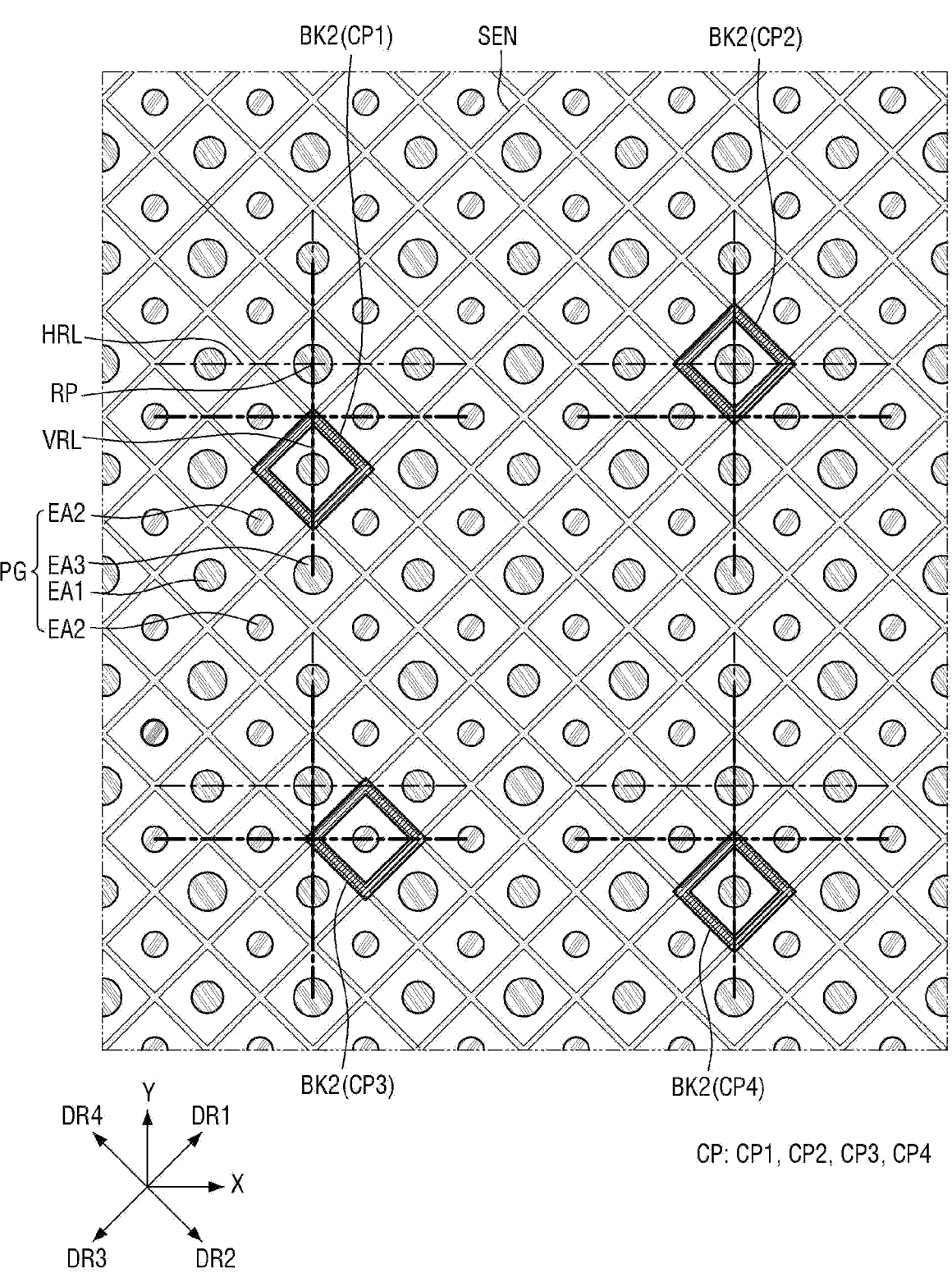
FIG. 26 is a schematic plan view illustrating still another example of a code pattern in a display device according to an embodiment.

FIG. 26 is a schematic plan view illustrating still another example of a code pattern in a display device according to an embodiment.

Referring to FIG. 26, a touch electrode SEN may be formed in a mesh structure or a net structure in a plan view. A second light blocking part BK2 may be disposed on the touch electrode SEN, and a code pattern CP may be determined by a planar shape of the second light blocking part BK2. The code pattern CP may surround one of first to third emission areas EA1, EA2, and EA3. The code pattern CP may be disposed to a side of a reference point RP. The reference point RP may correspond to an intersection point between a horizontal line HRL extending in an X-axis direction and a vertical line VRL extending in a Y-axis direction. The reference point RP may overlap the touch electrode SEN in a thickness direction. For example, the code pattern CP may be disposed to upper, lower, left, or right side of the reference point RP, but is not limited thereto. The code pattern CP may not overlap the first to third emission areas EA1, EA2, and EA3 in the thickness direction. Accordingly, the display device 10 may prevent a luminance of light emitted from the first to third emission areas EA1, EA2, and EA3 from being reduced by the second light blocking part BK2 or the code pattern CP.

The code pattern CP may include first to fourth code patterns CP1, CP2, CP3, and CP4. The first code pattern CP1 may be disposed on the lower side of the reference point RP, and a upper end of the first code pattern CP1 may overlap the reference point RP in the thickness direction. The second code pattern CP2 may be disposed on the upper side of the reference point RP, and a lower end of the second code pattern CP2 may overlap the reference point RP in the thickness direction. The third code pattern CP3 may be disposed on the right side of the reference point RP, and the left end of the third code pattern CP3 may overlap the reference point RP in the thickness direction. The fourth code pattern CP4 may be disposed on the lower side of the reference point RP, and an upper end of the fourth code pattern CP4 may overlap the reference point RP in the thickness direction. For example, the code pattern CP may have position information according to a planar shape of the first to fourth code patterns CP1, CP2, CP3, and CP4 or relative positions of the first to fourth code patterns CP1, CP2, CP3, and CP4 with respect to the reference point RP, but is not limited thereto. The code pattern CP may be photographed by a camera approaching a front of the display device 10, and may be identified through a captured picture or image. A combination of at least some of the first to fourth code patterns CP1, CP2, CP3, and CP4 may correspond to a preset data code value. For example, a combination of at least some of the first to fourth code patterns CP1, CP2, CP3, and CP4 disposed at a position may correspond to a data code designated at the corresponding position.

Figure 27:
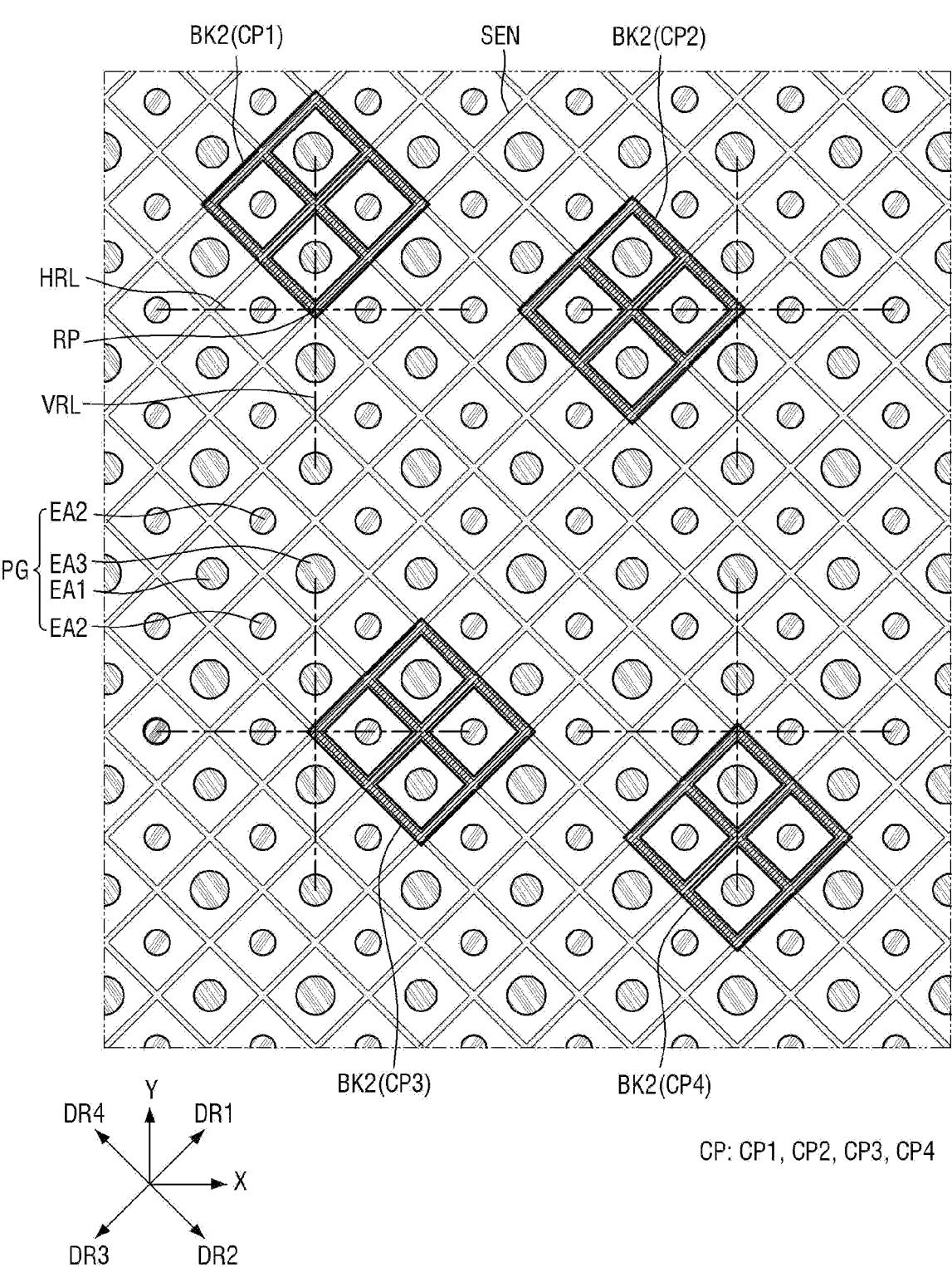
FIG. 27 is a schematic plan view illustrating still another example of a code pattern in a display device according to an embodiment.

FIG. 27 is a schematic plan view illustrating still another example of a code pattern in a display device according to an embodiment.

Referring to FIG. 27, a touch electrode SEN may be formed in a mesh structure or a net structure in a plan view. A second light blocking part BK2 may be disposed on the touch electrode SEN, and a code pattern CP may be determined by a planar shape of the second light blocking part BK2. The code pattern CP may be formed in a mesh structure or a net structure in a plan view. For example, the code pattern CP may surround a first emission area EA1 (e.g., one first emission area EA1), two second emission areas EA2, and a third emission area EA3 (e.g., one third emission area EA3) forming each pixel group PG, but is not limited thereto. The code pattern CP may be disposed to a side of a reference point RP. The reference point RP may correspond to an intersection point between a horizontal line HRL extending in an X-axis direction and a vertical line VRL extending in a Y-axis direction. The reference point RP may overlap the touch electrode SEN in a thickness direction. For example, the code pattern CP may be disposed to upper, lower, left, or right side of the reference point RP, but is not limited thereto.

The code pattern CP may include first to fourth code patterns CP1, CP2, CP3, and CP4. The first code pattern CP1 may be disposed on the upper side of the reference point RP, and a lower end of the first code pattern CP1 may overlap the reference point RP in the thickness direction. The second code pattern CP2 may be disposed on the left side of the reference point RP, and a right end of the second code pattern CP2 may overlap the reference point RP in the thickness direction. The third code pattern CP3 may be disposed on the right side of the reference point RP, and a left end of the third code pattern CP3 may overlap the reference point RP in the thickness direction. The fourth code pattern CP4 may be disposed on the lower side of the reference point RP, and the upper end of the fourth code pattern CP4 may overlap the reference point RP in the thickness direction. For example, the code pattern CP may have position information according to the planar shape of the first to fourth code patterns CP1, CP2, CP3, and CP4 or relative positions of the first to fourth code patterns CP1, CP2, CP3, and CP4 with respect to the reference point RP, but is not limited thereto. The code pattern CP may be photographed by a camera approaching a front of the display device 10, and may be identified through a captured picture or image. A combination of at least some of the first to fourth code patterns CP1, CP2, CP3, and CP4 may correspond to a preset data code value. For example, a combination of at least some of the first to fourth code patterns CP1, CP2, CP3, and CP4 disposed at a position may correspond to a data code designated at the corresponding position.

Figure 28:
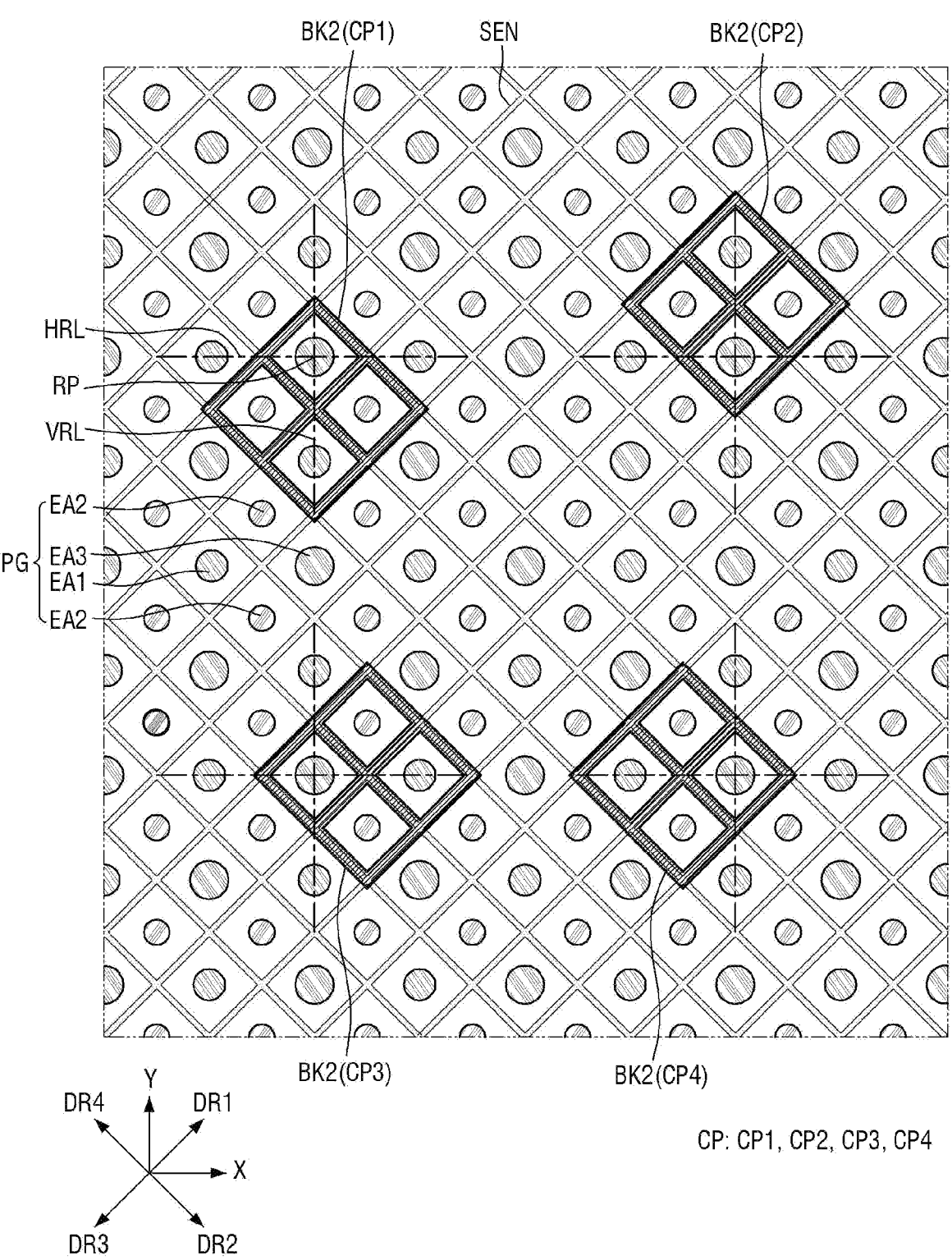
FIG. 28 is a schematic plan view illustrating still another example of a code pattern in a display device according to an embodiment.

FIG. 28 is a schematic plan view illustrating still another example of a code pattern in a display device according to an embodiment.

Referring to FIG. 28, a touch electrode SEN may be formed in a mesh structure or a net structure in a plan view. A second light blocking part BK2 may be disposed on the touch electrode SEN, and a code pattern CP may be determined by a planar shape of the second light blocking part BK2. The code pattern CP may be formed in a mesh structure or a net structure in a plan view. For example, the code pattern CP may surround a first emission area EA1 (e.g., one first emission area EA1), two second emission areas EA2, and a third emission area EA3 (e.g., one third emission area EA3) forming each pixel group PG, but is not limited thereto. A center of the code pattern CP may be disposed to a side of the reference point RP. The reference point RP may correspond to an intersection point between a horizontal line HRL extending in an X-axis direction and a vertical line VRL extending in a Y-axis direction. The reference point RP may overlap one of the first to third emission areas EA1, EA2, and EA3 in the thickness direction. For example, a center of the code pattern CP may be disposed to upper, lower, left, or right side of the reference point RP, but is not limited thereto.

The code pattern CP may include first to fourth code patterns CP1, CP2, CP3, and CP4. A center of the first code pattern CP1 may be disposed to the lower side of the reference point RP, and a part of the first code pattern CP1 may surround the reference point RP. A center of the second code pattern CP2 may be disposed to the upper side of the reference point RP, and a part of the second code pattern CP2 may surround the reference point RP. A center of the third code pattern CP3 may be disposed to the right side of the reference point RP, and a part of the third code pattern CP3 may surround the reference point RP. A center of the fourth code pattern CP4 may be disposed to the left side of the reference point RP, and a part of the fourth code pattern CP4 may surround the reference point RP. For example, the code pattern CP may have position information according to a planar shape of the first to fourth code patterns CP1, CP2, CP3, and CP4 or relative positions of the first to fourth code patterns CP1, CP2, CP3, and CP4 with respect to the reference point RP, but is not limited thereto. The code pattern CP may be photographed by a camera approaching a front of the display device 10, and may be identified through a captured picture or image. A combination of at least some of the first to fourth code patterns CP1, CP2, CP3, and CP4 may correspond to a preset data code value. For example, a combination of at least some of the first to fourth code patterns CP1, CP2, CP3, and CP4 disposed at a position may correspond to a data code designated at the corresponding position.

Figure 29:
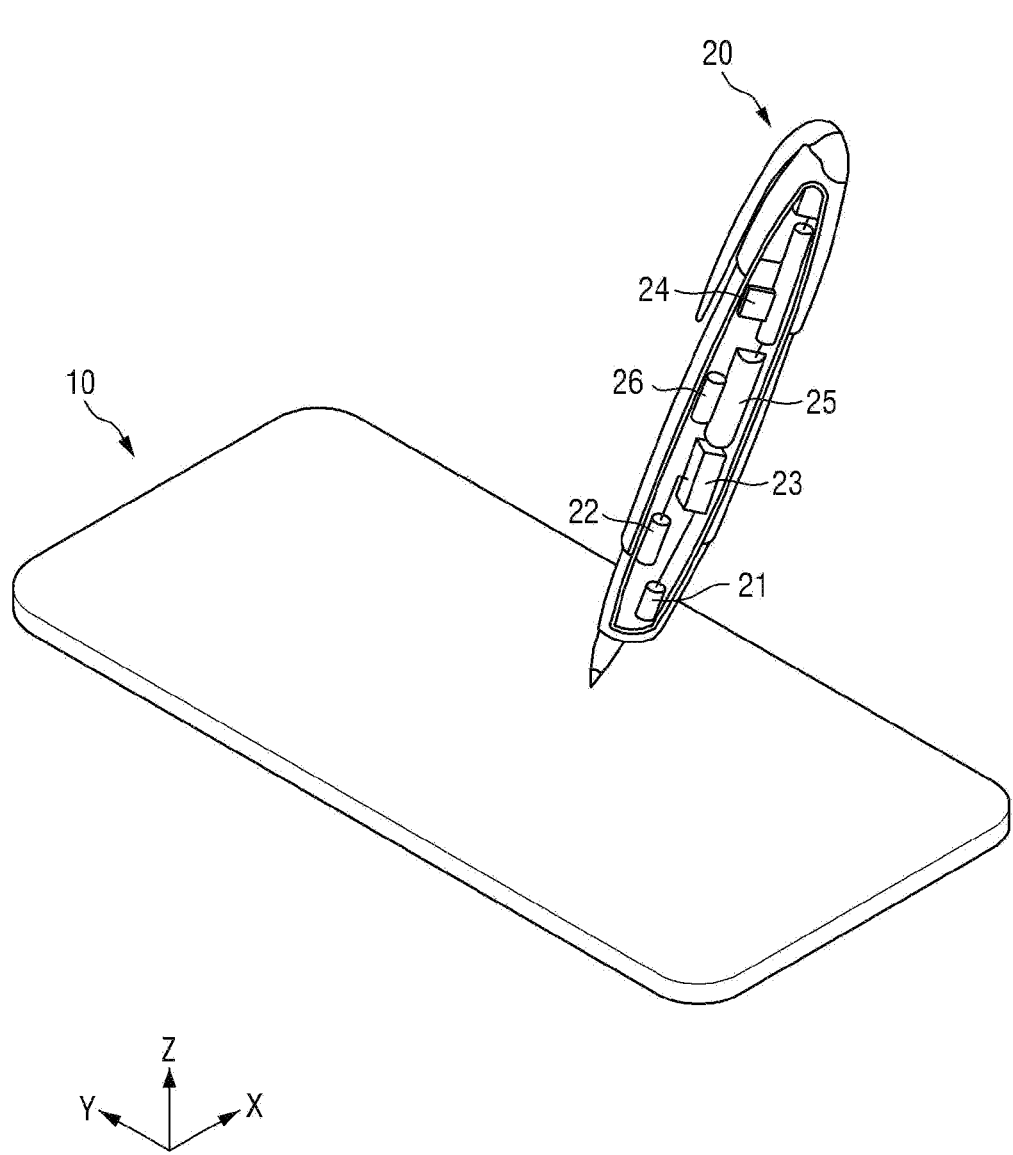
FIG. 29 is a schematic perspective view illustrating an input system according to an embodiment.
Figure 30:
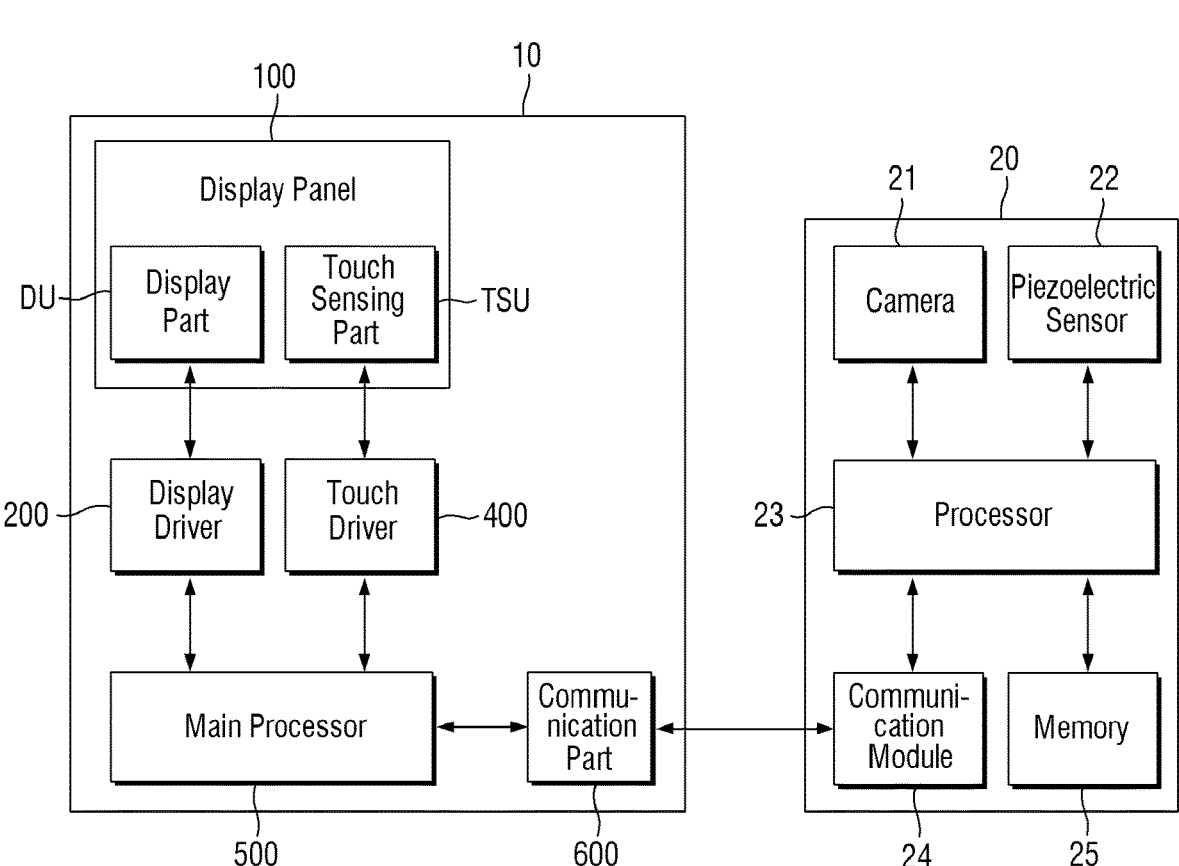
FIG. 30 is a schematic block diagram illustrating a display device and an input device in an input system according to an embodiment.

FIG. 29 is a schematic perspective view illustrating an input system according to an embodiment. FIG. 30 is a schematic block diagram illustrating a display device and an input device in an input system according to an embodiment.

Referring to FIGS. 29 and 30, the input system may include a display device 10 and an input device 20.

The display device 10 may include a display panel 100, a display driver 200, a touch driver 400, a main processor 500, and a communication part 600.

The display panel 100 may include a display part DU and a touch sensing part TSU. The display part DU may include pixels to display an image.

The touch sensing part TSU may include touch electrodes SEN to sense a user's touch in a capacitive manner. The display device 10 may detect a touch or approach of a input device 20 by including a code pattern CP. The code pattern CP may be determined by a planar shape of a second light blocking part BK2 to have position information. At least one code pattern CP or a combination of the code patterns CP may correspond to a preset data code value.

The display driver 200 may output signals and voltages for driving the display part DU. The display driver 200 may supply data voltages to data lines. The display driver 200 may supply a power voltage to a power line and may supply gate control signals to a gate driver.

The touch driver 400 may be electrically connected to the touch sensing part TSU. The touch driver 400 may supply a touch driving signal to touch electrodes SEN of the touch sensing part TSU and may sense an amount of change in capacitance between the touch electrodes SEN. The touch driver 400 may calculate whether a user's input is made and input coordinates based on an amount of change in capacitance between the touch electrodes SEN.

The main processor 500 may control all functions of the display device 10. For example, the main processor 500 may supply digital video data to the display driver 200, and the display panel 100 may display an image. For example, the main processor 500 may receive touch data from the touch driver 400 to determine user's input coordinates, and may generate digital video data according to the input coordinates, or execute an application indicated by an icon displayed on the user's input coordinates. As another example, the main processor 500 may receive coordinate data from the input device 20 to determine input coordinates of the input device 20, and may generate digital video data according to the input coordinates or execute an application indicated by an icon displayed on the input coordinates of the input device 20.

The communication part 600 may perform wired/wireless communication with an external device. For example, the communication part 600 may transmit/receive a communication signal to/from a communication module 24 of the input device 20. The communication part 600 may receive coordinate data composed of data codes from the input device 20, and may provide the coordinate data to the main processor 500.

The input device 20 may include a camera 21, a piezoelectric sensor 22, a processor 23, a communication module 24, a memory 25, and a battery 26. For example, the input device 20 may be an input pen that generates coordinate data using an optical method. The input pen may be a smart pen, an electromagnetic pen, or an active pen, but is not limited thereto.

The camera 21 may be disposed in front of the input device 20. The camera 21 may photograph the code pattern CP determined by a planar shape of the second light blocking part BK2. Along the movement of the input device 20, the camera 21 may continuously photograph the code pattern CP of the corresponding position. The camera 21 may provide the captured image to the processor 23. For example, the camera 21 may photograph the code pattern CP using infrared light, but is not limited thereto.

The piezoelectric sensor 22 may sense a pressure applied by the input device 20 to the display device 10. The piezoelectric sensor 22 may provide pressure information of the input device 20 to the processor 23.

The processor 23 may receive an image of the code pattern CP from the camera 21. The processor 23 may convert the code pattern CP into a corresponding data code, and may generate coordinate data by combining the data codes. The processor 23 may transmit the generated coordinate data to the display device 10 through the communication module 24.

The processor 23 may receive the image of the code pattern CP and convert at least one code pattern CP or a combination of the code patterns CP into a data code corresponding one-to-one, thereby rapidly generating the coordinate data without complex calculation or correction. Accordingly, an input system may perform a corresponding function based on accurate input coordinates, reduce cost and power consumption, and simplify a driving process. Since an input system includes the code patterns CP provided on the color filter layer CFL or the anti-reflection layer RCL, the input system is not limited in size and may be applied to all electronic devices having a touch function.

The communication module 24 may perform wired/wireless communication with an external device. For example, the communication module 24 may transmit/receive a communication signal to/from the communication part 600 of the display device 10. The communication module 24 may receive coordinate data composed of data codes from the processor 23, and may provide the coordinate data to the communication part 600.

The memory 25 may store data necessary for driving the input device 20. Since the input device 20 may convert at least one code pattern CP or a combination of the code patterns CP into a data code corresponding one-to-one and may provide (e.g., directly provide) coordinate data to the display device 10, the memory 25 may have a relatively small capacity.

Although embodiments have been disclosed for illustrative purposes, those skilled in the art will appreciate that various modifications, additions and substitutions are possible, without departing from the scope and spirit of the disclosure as disclosed in the accompanying claims and their equivalents.

What is claimed is:

1. A display device comprising:
   a display part including a light emitting element disposed in a plurality of emission areas to emit light;
   a plurality of touch electrodes disposed in a light blocking area surrounding the plurality of emission areas on the display part to sense a touch;
   a first light blocking part disposed in a part of the light blocking area on the plurality of touch electrodes;

a second light blocking part disposed in another part of the light blocking area on the plurality of touch electrodes; and a code pattern determined by a planar shape of the second light blocking part to have position information, wherein the first light blocking part comprises one of an inorganic black pigment and an organic black pigment, and the second light blocking part comprises the other of the inorganic black pigment and the organic black pigment.

2. The display device of claim 1, wherein the first light blocking part and the second light blocking part are disposed on a same layer.

3. The display device of claim 1, further comprising:

a plurality of color filters disposed in the plurality of emission areas on the plurality of touch electrodes.

4. The display device of claim 3, wherein the first light blocking part, the second light blocking part, and the plurality of color filters are disposed on a same layer.

5. The display device of claim 3, wherein the second light blocking part does not overlap the plurality of color filters in a thickness direction.

6. The display device of claim 1, further comprising:

an insulating layer disposed between the plurality of touch electrodes and the first light blocking part.

7. The display device of claim 1, further comprising:

an anti-reflection portion disposed in the plurality of emission areas on the plurality of touch electrodes.

8. The display device of claim 7, wherein the first light blocking part, the second light blocking part, and the anti-reflection portion are disposed on a same layer.

9. The display device of claim 7, wherein the second light blocking part does not overlap the anti-reflection portion in a thickness direction.

10. The display device of claim 1, wherein the code pattern surrounds at least one of the plurality of emission areas.

11. The display device of claim 1, wherein the code pattern comprises:

a first portion extending in a first direction; and a second portion intersecting the first portion.

12. The display device of claim 1, wherein the code pattern comprises a plurality of code patterns, and the plurality of code patterns have position information according to a distance between the plurality of code patterns.

13. The display device of claim 1, wherein the code pattern has position information according to a relative position with respect to a reference point overlapping the plurality of touch electrodes in a thickness direction.

14. The display device of claim 1, wherein the display part comprises:

a thin film transistor layer disposed on a substrate and comprising a plurality of thin film transistors;

a light emitting element layer disposed on the thin film transistor layer and comprising a plurality of light emitting elements; and an encapsulation layer covering the light emitting element layer, and the plurality of touch electrodes are disposed on the encapsulation layer.

15. A display device comprising:

a display part comprising a light emitting element disposed in a plurality of emission areas to emit light;

a plurality of touch electrodes disposed in a light blocking area surrounding the plurality of emission areas on the display part to sense a touch;

a first light blocking part disposed in the light blocking area on the plurality of touch electrodes;

a second light blocking part disposed on a part of the first light blocking part; and a plurality of code patterns determined by a planar shape of the second light blocking part, wherein the first light blocking part comprises one of an inorganic black pigment and an organic black pigment, the second light blocking part comprises the other of the inorganic black pigment and the organic black pigment, and the plurality of code patterns have position information according to a distance between the plurality of code patterns and a planar shape.

16. The display device of claim 15, further comprising:

a plurality of color filters disposed in the plurality of emission areas on the plurality of touch electrodes.

17. The display device of claim 16, wherein the first light blocking part and the plurality of color filters are disposed on a same layer.

18. The display device of claim 17, wherein the second light blocking part does not overlap the plurality of color filters in a thickness direction.

19. The display device of claim 15, further comprising:

an anti-reflection portion disposed in the plurality of emission areas on the plurality of touch electrodes.

20. An input system comprising:

a display device that displays an image; and an input device that inputs a touch into the display device, wherein the display device comprises:

a display part comprising a light emitting element disposed in a plurality of emission areas to emit light;

a plurality of touch electrodes disposed in a light blocking area surrounding the plurality of emission areas on the display part to sense a touch;

a first light blocking part disposed in a part of the light blocking area on the plurality of touch electrodes;

a second light blocking part disposed in another part of the light blocking area on the plurality of touch electrodes; and a code pattern determined by a planar shape of the second light blocking part to have position information, the first light blocking part comprises one of an inorganic black pigment and an organic black pigment, the second light blocking part comprises another one of the inorganic black pigment and the organic black pigment, and the input device photographs the code pattern, converts the code pattern into a preset data code, and transmits coordinate data composed of the data codes to the display device.

* * * * *